(12) United States Patent
Liu et al.

(10) Patent No.: US 11,289,393 B2
(45) Date of Patent: Mar. 29, 2022

(54) METHODS, DEVICES, AND SYSTEMS FOR ELECTRONIC DEVICE MOLDING AND ENCAPSULATION

(71) Applicant: Flex Ltd., Singapore (SG)

(72) Inventors: Weifeng Liu, Dublin, CA (US); Jesus A. Tan, Fremont, CA (US); William L. Uy, San Jose, CA (US); Dongkai Shangguan, San Jose, CA (US)

(73) Assignee: Flex Ltd., Singapore (SG)

( * ) Notice: Subject to any disclaimer, the term of this patent is extended or adjusted under 35 U.S.C. 154(b) by 82 days.

(21) Appl. No.: 16/793,788

(22) Filed: Feb. 18, 2020

(65) Prior Publication Data

US 2021/0193543 A1 Jun. 24, 2021

Related U.S. Application Data

(60) Provisional application No. 62/953,341, filed on Dec. 24, 2019.

(51) Int. Cl.
*H01L 23/31* (2006.01)
*H01L 21/56* (2006.01)
*B29C 45/14* (2006.01)

(52) U.S. Cl.
CPC ........ *H01L 23/3128* (2013.01); *H01L 21/565* (2013.01); *B29C 45/14418* (2013.01); *B29C 45/14655* (2013.01)

(58) Field of Classification Search
None
See application file for complete search history.

(56) References Cited

U.S. PATENT DOCUMENTS

| | | | |
|---|---|---|---|
| 2016/0056091 A1* | 2/2016 | Kim | H01L 23/552 |
| | | | 257/368 |
| 2017/0320725 A1* | 11/2017 | Goida | H01L 23/041 |

* cited by examiner

*Primary Examiner* — Jay C Chang
(74) *Attorney, Agent, or Firm* — Sheridan Ross P.C.

(57) ABSTRACT

Methods, devices, and systems are provided for the molding and encapsulation of flexible electronic devices. The encapsulation includes providing a mold shell made from an encapsulation material, positioning a flexible electronic device in the mold shell, and dispensing an encapsulant, in a liquid form, around the flexible electronic device. The mold shell, the dispensed encapsulant, and the electronic device forms an integral encapsulation package when the encapsulant is cured. The mold shell and the encapsulant may be made from a same material and, once cured, become an integral part of the encapsulated flexible electronic device.

20 Claims, 10 Drawing Sheets

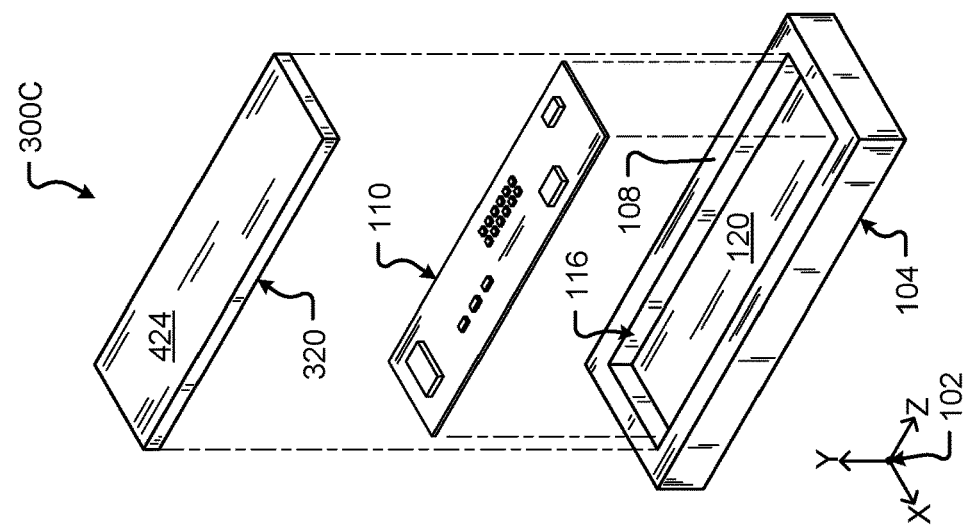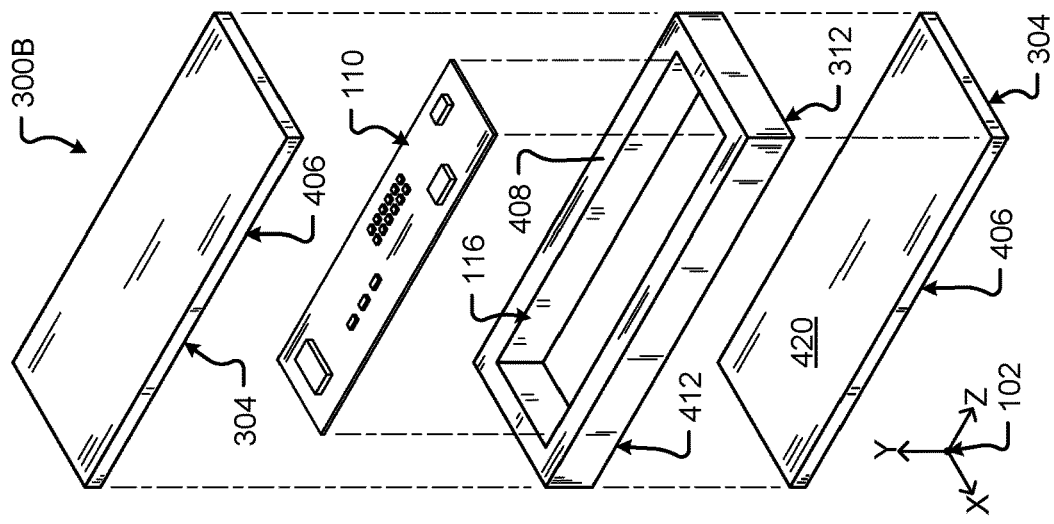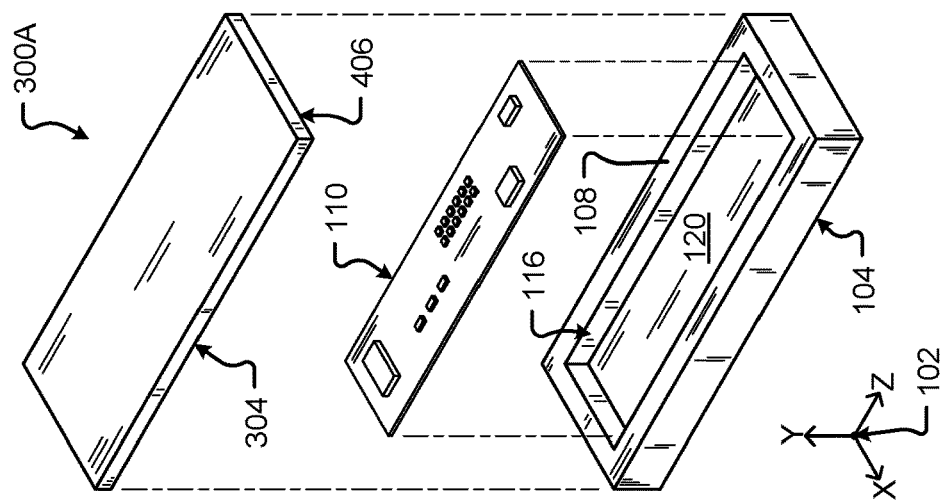

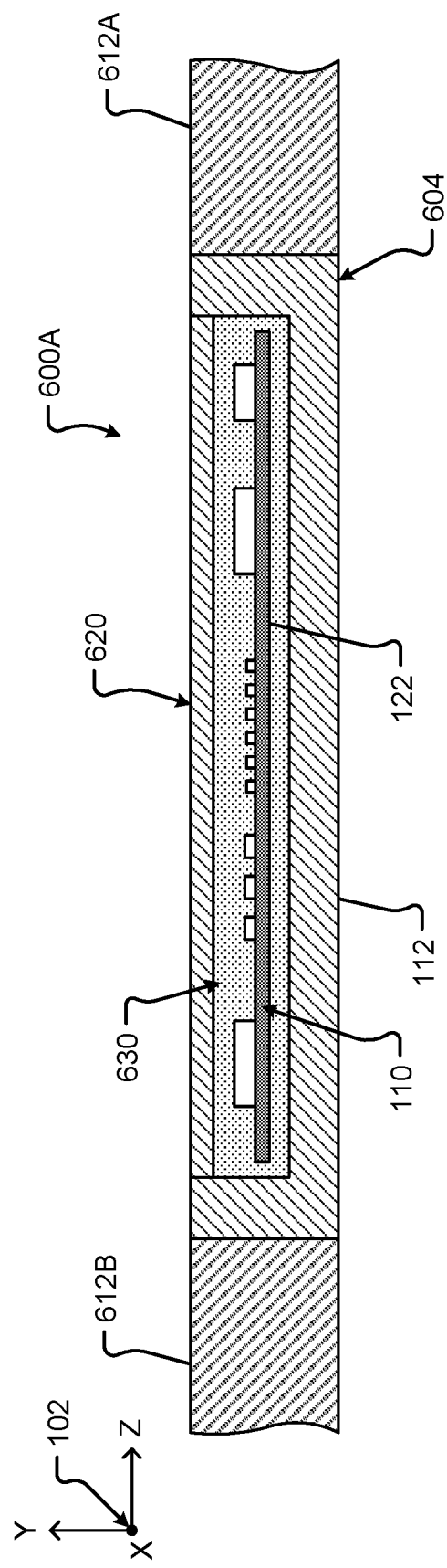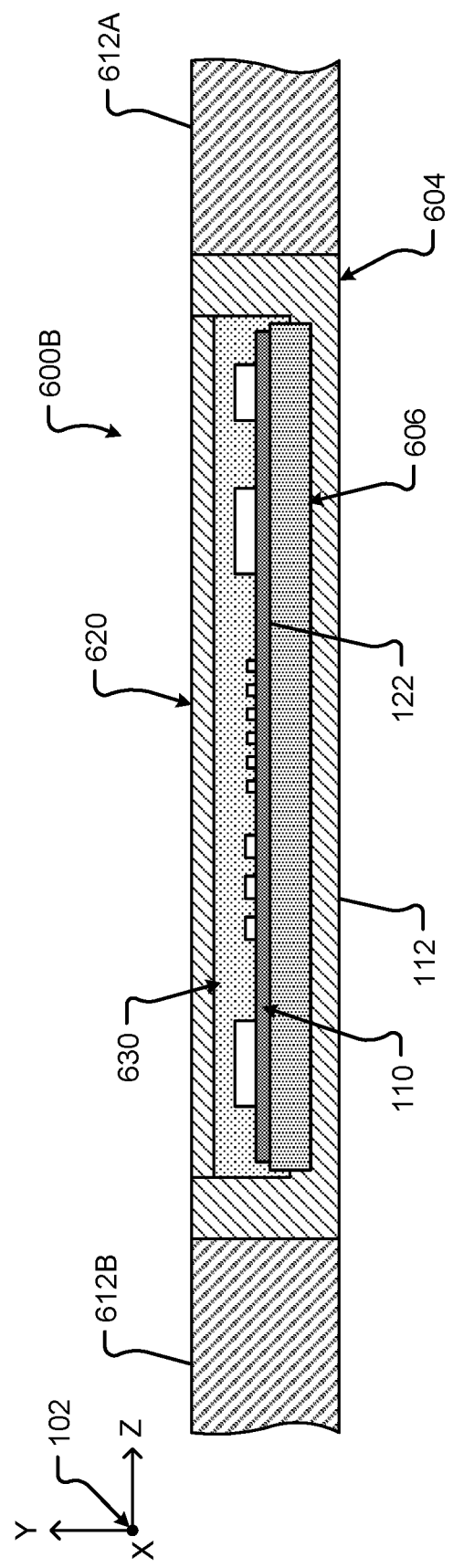

METHODS, DEVICES, AND SYSTEMS FOR ELECTRONIC DEVICE MOLDING AND ENCAPSULATION

CROSS REFERENCE TO RELATED APPLICATIONS

The present application claims the benefit of and priority, under 35 U.S.C. § 119, to U.S. Provisional Application Ser. No. 62/953,341, filed on Dec. 24, 2019, entitled "METHODS, DEVICES, AND SYSTEMS FOR ELECTRONIC DEVICE MOLDING AND ENCAPSULATION," the entire disclosure of which is hereby incorporated herein by reference, in its entirety, for all that it teaches and for all purposes.

FIELD

The present disclosure is generally directed to electronic devices, in particular, toward the encapsulation of electronic devices with a protective material.

BACKGROUND

The conventional encapsulation of electronics generally includes arranging an electronic device, or module, inside a mold cavity and then molding (e.g., via injection molding, compression molding, etc.) an encapsulation material around the electronic device. Once cured, the encapsulation material, or encapsulant, protects the electronic device from mechanical shock, moisture, debris, or other environmental exposure and/or damage. These conventional encapsulation methods can require the use of complex mold tooling where the electronic device is exposed to an encapsulant delivered under high pressure and/or high temperature.

BRIEF DESCRIPTION OF THE DRAWINGS

FIG. 4A shows an exploded perspective view of the encapsulated flexible electronic device of FIG. 3A in accordance with embodiments of the present disclosure;

FIG. 4B shows an exploded perspective view of the encapsulated flexible electronic device of FIG. 3B in accordance with embodiments of the present disclosure;

FIG. 4C shows an exploded perspective view of the encapsulated flexible electronic device of FIG. 3C in accordance with embodiments of the present disclosure;

FIG. 6A shows a cross-section view of a combination flexible and rigid package of the encapsulated flexible electronic device in accordance with embodiments of the present disclosure;

FIG. 6B shows a cross-section view of a reinforced combination flexible and rigid package of the encapsulated flexible electronic device in accordance with embodiments of the present disclosure;

DESCRIPTION

Figure 1A:
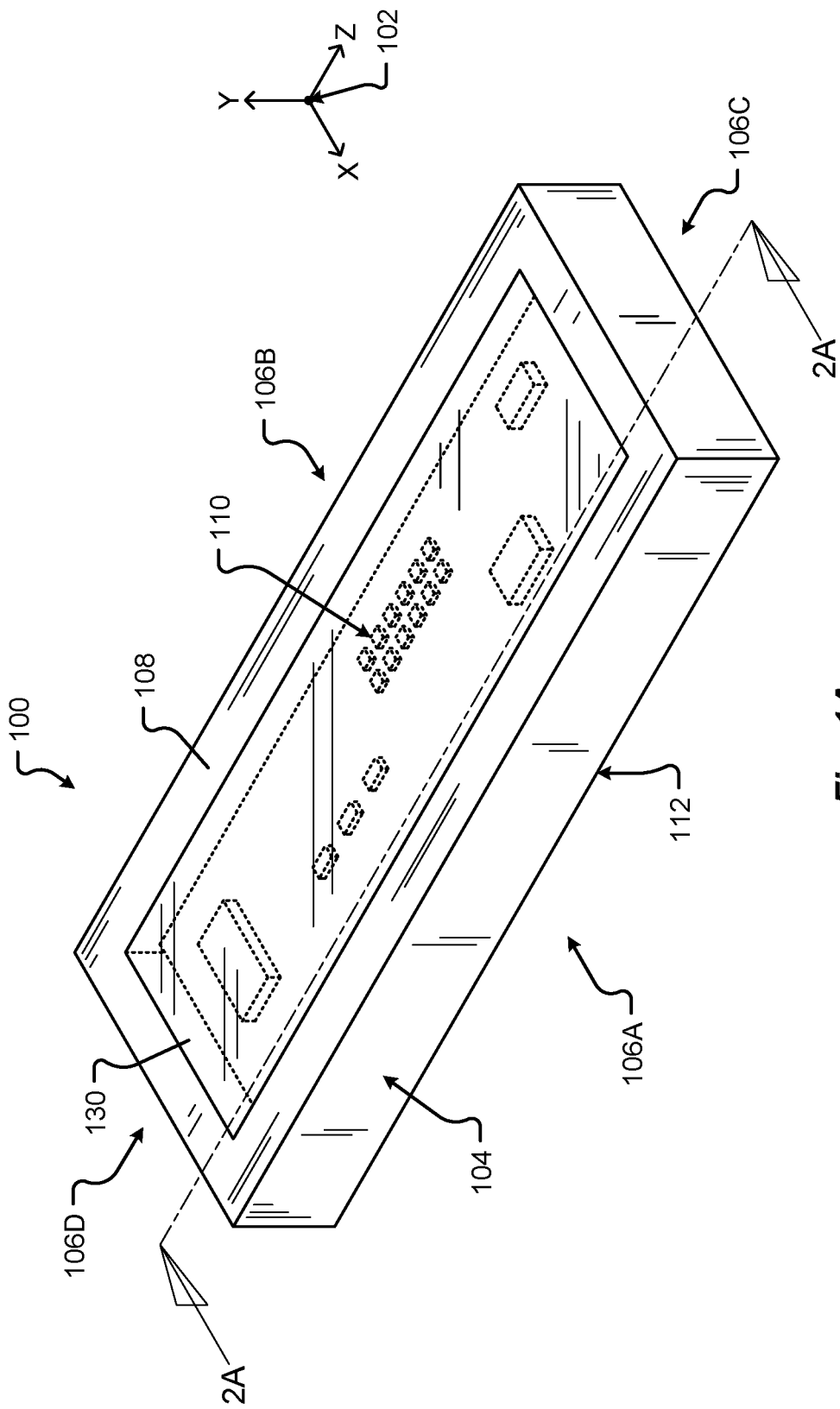
FIG. 1A shows a perspective view of an encapsulated flexible electronic device in accordance with embodiments of the present disclosure.

It is with respect to the above issues and other problems that the embodiments presented herein were contemplated. It is an object the present disclosure to provide a reliable, safe, and low-cost method of encapsulation for electronic devices. Examples of the electronic devices described herein may include, but are in no way limited to, printed circuit boards (PCBs), computer chips, chipsets, physical memory devices, communications antenna, surface-mount components, through-mount components, power supplies, electrical circuits, traces, etc., and/or combinations thereof. In some embodiments, the method utilizes an encapsulation material, or encapsulant, as a mold shell, or portion of a mold, to receive an added encapsulation material to at least partially cover an electronic device, or module.

The mold shell (e.g., made from the encapsulation material) may then become part of the final product (e.g., along with the added encapsulation material). The use of the encapsulation material as the mold shell eliminates the tooling costs associated with a separate mold (e.g., an injection mold, mold tooling, molding system, etc.) for encapsulating electronic devices. For instance, rather than using a metal mold, into which a liquid encapsulant is injected or otherwise formed and cured around the electronic device, the present disclosure describes a mold that is made from an encapsulation material and capable of receiving added encapsulation material to form an integral encapsulation package around the electronic device. In contrast to a conventional molding method, where the encapsulated electronic device must be separated from the metal mold before being integrated into a system, the mold in the present disclosure is a part of the integral encapsulation package and may remain with the electronic device. Stated another way, the mold described in the present disclosure does not need to be separated from the final electronics device package.

In some embodiments, the method may begin by selecting a suitable encapsulation material for the mold. The encapsulation material may correspond to any material capable of supporting and encapsulating an electronic device. Examples of encapsulation materials, or encapsulant, may include, but are in no way limited to, silicone, thermoplastic polyurethane (TPU), rubber, room-temperature vulcanizing (RTV) silicone, epoxy, acrylic, polymer materials, resins, thermosetting plastic, adhesive potting compounds, potting materials, etc., and/or combinations thereof. The selection of the encapsulation material may depend on the particular industry and/or application for the electronic device. For instance, the encapsulation material may be selected for particular insulative properties (e.g., thermal, electric, etc.), moisture-blocking capabilities, mechanical shock absorption, and/or the like.

Once the encapsulation material is selected, the mold shell may be formed. The mold base may comprise at least one layer of material shaped to support at least a portion of the electronic device. In one embodiment, the encapsulation material may be formed to include an opening, or a cavity, into which the electronic device may be placed and/or retained. In some embodiments, the mold may comprise a top layer, a middle layer, and a bottom layer of encapsulation material, which may be arranged to surround the electronic device. Forming the mold shell may include casting, or molding, the encapsulation material into a predetermined shape (e.g., sheet, housing, box, hollow structure, etc.). The mold shell may be formed into the predetermined shape using any molding, casting, machining, or forming technique. In some embodiments, at least a portion of the mold shell may be made before integrating with the electronic device.

In one embodiment, the mold shell may be formed as a three-dimensional solid comprising an electronic device receiving cavity. The cavity may be formed via a molding technique utilizing a mold core, casting the mold base in a machined body including a corresponding cavity protrusion, or other technique while the mold shell is being formed. In some embodiments, the cavity may be formed after the mold shell is formed. For example, the cavity may be machined, etched, and/or cut into the three-dimensional solid (e.g., via laser cutting, die cutting, etc.). In any case, the cavity may be formed such that an electronic module, or electronic device, may be placed therein.

Encapsulating the electronic device may include positioning the device onto, or inside, the mold shell. Once arranged on, or inside, the mold shell, the method may continue by disposing encapsulation material around the electronic device and onto, or into, the mold shell. In one embodiment, the encapsulation material may be poured (e.g., in a liquid form) onto the electronic device and/or into the cavity of the mold shell. In some embodiments, this liquid encapsulant may be a combination of two or more materials. For example, two liquid or pourable materials may be mixed together to form the liquid encapsulant.

Once the liquid encapsulant is formed, it may be deposited in the mold shell holding or otherwise supporting the electronic device. Depositing the liquid encapsulant may include injecting, pouring, or otherwise spreading the liquid encapsulant around the electronic device in the mold base. In some embodiments, the liquid encapsulant may be cast into the pre-made mold shell around the electronic device.

The liquid encapsulant dispensed over the electronic device may bond to one or more surfaces of the electronic device, the mold shell, and/or both the mold and the electronic device. In some embodiments, the liquid encapsulant may be the same material as the mold shell (e.g., the mold shell and the liquid encapsulant may both be silicone, epoxy, etc.). In one embodiment, the liquid encapsulant may be a different material than the mold (e.g., the mold shell may be TPU and the liquid encapsulant may be an epoxy, etc.). The liquid encapsulant material may vary, and is not particularly limited. For example, the liquid encapsulant may be, but is in no way limited to, silicone, TPU, rubber, RTV silicone, polymer materials, resins, thermosetting plastic, adhesive potting compounds, potting materials, acrylic, epoxy, etc., and/or combinations thereof. In some embodiments, the liquid encapsulant may be pre-mixed and/or degassed before being dispensed onto the mold shell and electronic device. This step may ensure the correct chemical properties of the liquid encapsulant prior to use. In some embodiments, the liquid encapsulant may be dispensed into the cavity of the mold shell prior to inserting the electronic device into the cavity of mold shell. This may be done to ensure the bottom of the electronic module is exposed to the liquid encapsulant and properly bonds to the mold shell.

In some embodiments, the electronic module may have connective wiring exiting through the liquid encapsulant, the mold, and/or both. For instance, in one embodiment, the electronic module may contain at least one ribbon cable, connector, pin, and/or other electrical contact that protrudes through the liquid encapsulant, or the mold shell, to allow the electronic device to be electrically interconnected to another component through the integral encapsulation package. The type of wiring or electrical connections are not limited to ribbon cables, pins, or other connectors, and other connections, such as pre-potted pins, bulkhead connectors, and/or the like, may be used to provide an electrical interconnection from an outside of the integral encapsulation package to the electronic device encapsulated therein.

After the liquid encapsulant is dispensed, the dispensed liquid encapsulant is cured. The liquid encapsulant may be heat cured, time cured, ultraviolet (UV) light cured, and/or combinations thereof. In one embodiment, heat curing may include an application of heat (e.g., via thermal conduction, thermal convection, and/or thermal radiation). In some embodiments, the integral encapsulation package may be baked to a predetermined temperature to cure and/or otherwise set the dispensed liquid encapsulant forming the integral encapsulation package. In one embodiment, the liquid encapsulant material may be light-curable and a UV light can be used to cure the dispensed liquid encapsulant.

In some embodiments, a top encapsulant layer may be placed on top of the mold shell and the liquid encapsulant to fully seal and/or form the integral encapsulation package, or encapsulated flexible electronic device. The top encapsulant layer, or cover, is not limited to any particular material, and may be made from any of the materials listed above. In some embodiments, the material of the top encapsulant layer may include one or more textiles or natural materials (e.g., leather, fabric, and/or the like). In one embodiment, the top encapsulant layer may comprise one or more layers and/or sub-layers. The top encapsulant layer may be bonded to the top of the apparatus and subsequently cured to form the integral encapsulation package. In some embodiments, the liquid encapsulant in the mold shell may be only partially cured prior to the placement of the top encapsulant layer, and subsequently cured together after the addition of the top encapsulant layer ensuring the liquid encapsulant bonds to the top encapsulant layer forming the integral encapsulation package.

Figure 1B:
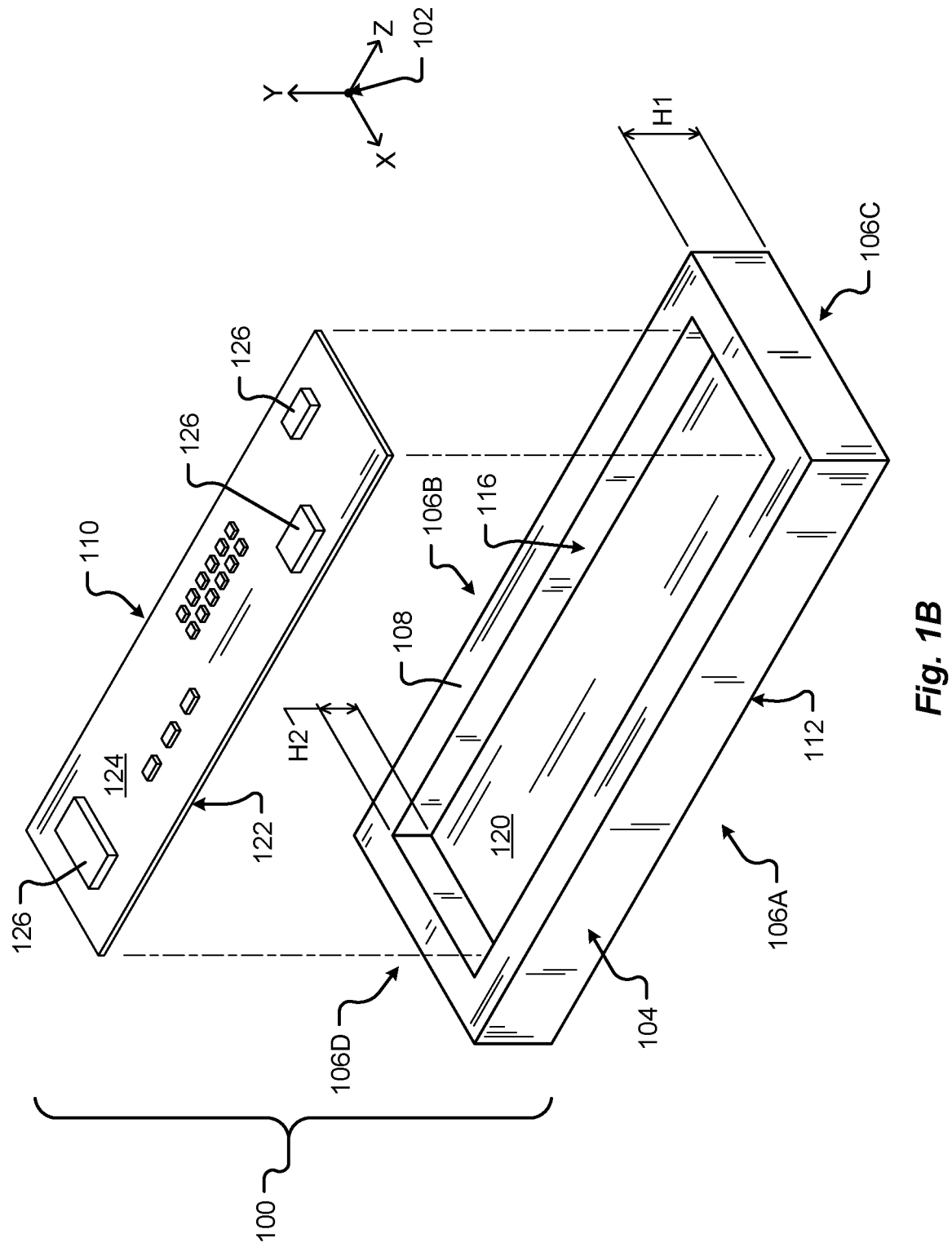
FIG. 1B shows an exploded perspective view of the encapsulated flexible electronic device of FIG. 1A in accordance with an embodiment of the present disclosure.

Referring now to FIGS. 1A-1B, perspective views of an encapsulated flexible electronic device 100 are shown in accordance with embodiments of the present disclosure. The encapsulated flexible electronic device 100 may comprise a mold shell 104, a flexible electronic device 110 disposed in a cavity 116 of the mold shell 104, and an encapsulant 130 disposed around the flexible electronic device 110. Encapsulating the flexible electronic device 110 may comprise pouring, or otherwise dispensing, the encapsulant 130 in a liquid form into the cavity 116 containing the flexible electronic device 110. As the encapsulant 130 flows around the flexible electronic device 110 inside the cavity 116 of the mold shell 104, the encapsulant 130 may fill and/or cover the flexible electronic device 110. It is an aspect of the present disclosure that the encapsulant 130, once cured, may adhere to both the surfaces of the flexible electronic device 110 as well as the surfaces of the cavity 116 of the mold shell 104.

In some embodiments, reference may be made to dimensions, angles, directions, relative positions, and/or movements associated with one or more components of the encapsulated flexible electronic device with respect to a coordinate system 102. The coordinate system 102, as shown in the accompanying figures, includes three-dimensions comprising an X-axis, a Y-axis, and a Z-axis. Additionally or alternatively, the coordinate system 102 may be used to define planes (e.g., the XY-plane, the XZ-plane, and the YZ-plane) of the encapsulated flexible electronic device 100. These planes may be disposed orthogonal, or at 90 degrees, to one another. While the origin of the coordinate system may be placed at any point on or near the components of the encapsulated flexible electronic device 100, for the purposes of description, the axes of the coordinate system 102 are always disposed along the same directions from figure to figure. As shown in FIG. 1A, the length of the encapsulated flexible electronic device 100 may be defined as the dimension along the Z-axis, the height of the encapsulated flexible electronic device 100 may be defined as the dimension along the Y-axis, and the width of the encapsulated flexible electronic device 100 may be defined as the dimension along the X-axis. Additionally or alternatively, the directionality of the X-axis, Y-axis, and Z-axis may be flipped, as noted with negative directionality (i.e., the negative X-axis direction is the opposite direction of the X-axis direction). Other dimensions, angles, and relative positions of the one or more components of the encapsulated flexible electronic device 100 may be as described herein.

The encapsulated flexible electronic device 100 comprises a mold shell 104 that is arranged to receive a flexible electronic device 110 and encapsulant 130. The mold shell 104 may be arranged as a three-dimensional structure having a first surface 108 that is offset from, and/or parallel to, a second surface 112 by a distance. As illustrated in FIG. 1B, this distance, H1, may define the overall height of the encapsulated flexible electronic device 100. The mold shell 104 may run from a first side 106A to a second side 106B, defining a width of the encapsulated flexible electronic device 100. The mold shell 104 may run from a third side 106C to a fourth side 106D, defining a length of the encapsulated flexible electronic device 100. Although shown having a three-dimensional rectangular shape, it should be appreciated that the mold shell 104, and/or the encapsulated flexible electronic device 100, may be formed in any shape.

The mold shell 104 may include a cavity 116, or recess, that is arranged to accommodate the flexible electronic device 110 and dispensed encapsulant 130. In some embodiments, the cavity 116 may correspond to a recess disposed in a body of the mold shell 104. For instance, the depth, H2, of the cavity 116 may be defined as a distance between the first surface 108 and an offset internal surface 120 of the cavity 116. As illustrated in FIG. 1B, the depth, H2, of the cavity is less than the height, H1, of the mold shell 104.

The flexible electronic device 110 may correspond to a flexible circuit, comprising one or more electronic devices 126 (e.g., microchips, processors, communications antennae, conductors, resistors, capacitors, transistors, wireless communications transmitters, wireless communications receivers, and/or the like) attached thereto. The flexible circuit may comprise a flexible substrate (e.g., made from polyimide, film, polyether ether ketone (PEEK), conductive foil and protective layer laminate, printed circuit, etc.) having an unflexed state and a flexed state. In some embodiments, the flexible electronic device 110 may elastically deform, or bend, from the unflexed state to the flexed state, and vice versa. The flexible electronic device 110 may comprise a single-sided flexible circuit board, a double-sided flexible circuit board, and/or a multi-layer flexible circuit board. In one embodiment, the flexible electronic device 110 may comprise both flexible and rigid portions. For example, a portion of the flexible electronic device 110 may be made from a flexible circuit board, while another portion of the flexible electronic device 110 may be made from a rigid printed circuit board (PCB).

In some embodiments, the flexible electronic device 110 may be arranged in the cavity 116 such that the contact surface 122 of the flexible electronic device 110 is offset, or separated a distance, from the internal surface 120 of the cavity 116. In one example, an amount of encapsulant 130 may be dispensed into the cavity 116 before disposing the flexible electronic device 110 therein. The amount of encapsulant 130 may be dispensed to completely cover the internal surface 120 of the cavity 116. In this example, however, the amount of encapsulant 130 may not be dispensed to completely fill the depth, H2, of the cavity 116. Once the amount of encapsulant 130 dispensed cures, at least partially, the flexible electronic device 110 may be disposed in the cavity 116 such that the contact surface 122 of the flexible electronic device 110 contacts the partially cured amount of encapsulant 130. As described herein, additional encapsulant 130 may be dispensed in the cavity 116 covering the first mount surface 124 and the electronic devices 126 attached to the flexible electronic device 110. This additional encapsulant 130 may be dispensed to be flush with the first surface 108 of the mold shell 104.

Additionally or alternatively, the internal surface 120 may comprise one or more protrusions (e.g., standoffs) extending from the internal surface 120 in a direction toward the first surface 108 of the mold shell 104. The one or more protrusions (not shown) may support the flexible electronic device 110 and allow the encapsulant 130 to flow under the flexible electronic device 110 when dispensed (e.g., in an area between the internal surface 120 and the contact surface 122 of the flexible electronic device 110) adhering the flexible electronic device 110 to the cover 304.

Figure 2A:
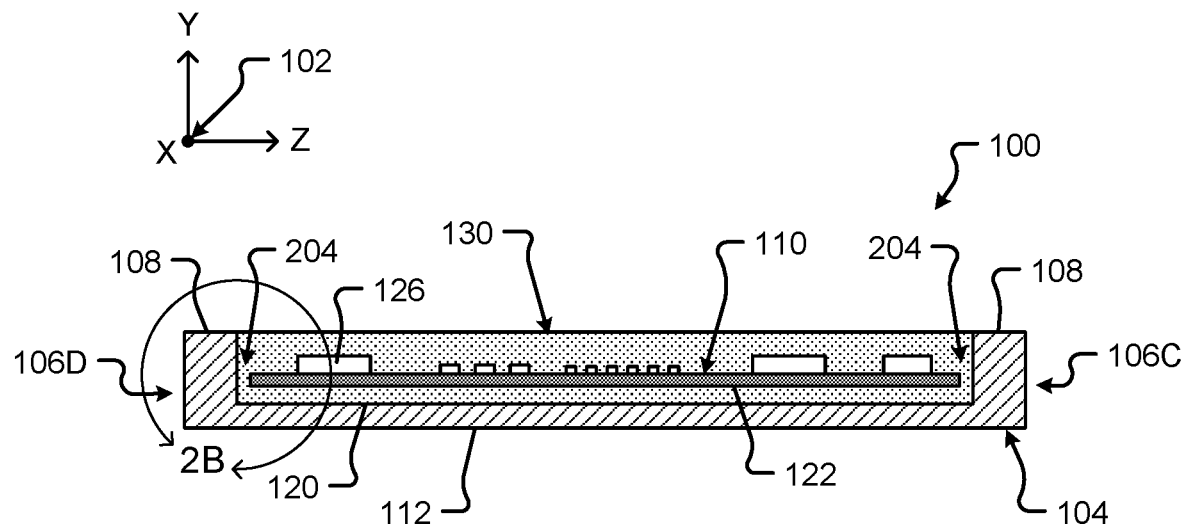
FIG. 2A shows a cross-section view of the encapsulated flexible electronic device of FIG. 1A taken through line 2A-2A.

FIG. 2A shows a cross-section view of the encapsulated flexible electronic device 100 of FIG. 1A taken through line 2A-2A. As provided above, the flexible electronic device 110 may be arranged such that no part of the flexible electronic device 110 contacts the interior walls and surfaces (e.g., internal surface 120) of the cavity 116 of the mold shell 104. For instance, the contact surface 122 of the flexible electronic device 110 may be separated, some distance, from the internal surface 120 of the cavity 116. Additionally or alternatively, the ends of the flexible electronic device 110 (e.g., closest to the third side 106C and the fourth side 106D of the mold shell 104) may be separated from the interior walls of the cavity 116 by a gap area 204. As the encapsulant 130 is dispensed into the cavity 116 containing the flexible electronic device 110, the encapsulant 130 may flow between the flexible electronic device 110 and the interior surfaces of the cavity 116. Once cured, the encapsulant 130 may provide a connection between the flexible electronic device 110 and the mold shell 104.

In one embodiment, the encapsulant 130 may be configured as a flexible material when cured. A flexible encapsulant 130 may prevent stresses applied by bending the mold shell 104 of the encapsulated flexible electronic device 100 from completely passing through to the flexible electronic device 110. Stated another way, the encapsulant 130 may provide a stress and/or strain cushion that protects the flexible electronic device 110 disposed in the encapsulated flexible electronic device 100. For instance, as the encapsulated flexible electronic device 100 is bent, for example, about the X-axis (e.g., out of the XZ-plane), the flexible encapsulant 130 may allow the material of the encapsulant 130 to stretch, or compress, without directly stretching, or compressing, the flexible electronic device 110.

Figure 2B:
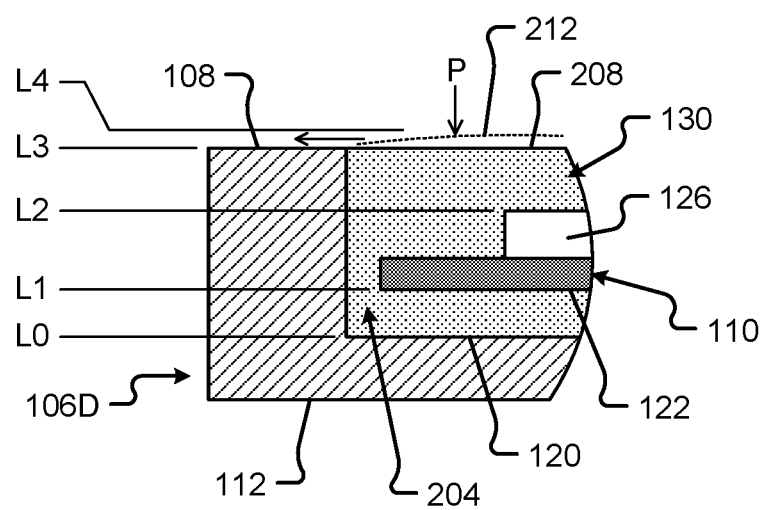
FIG. 2B shows a detail partial cross-section view of the encapsulated flexible electronic device of FIG. 2A taken from area 2B.

FIG. 2B shows a detail partial cross-section view of the encapsulated flexible electronic device 100 taken from area 2B of FIG. 2A. The cross-section view includes various feature level identifications defined by the identifiers L0-L4. These level identifiers may be used to identify positions of the flexible electronic device 110 in the cavity 116 and/or identify levels of encapsulant 130 dispensed, and/or cured, in the cavity 116. For instance, level L0 may correspond to the internal surface 120 of the cavity 116 from which all other levels (e.g., L1-L4) are measured. Level L1 may correspond to a level of an amount of encapsulant 130 dispensed into the cavity 116 (e.g., that covers the internal surface 120 of the cavity 116). As described above, the flexible electronic device 110 may be rested on, or placed into contact with, the amount of encapsulant 130 dispensed at level L1. In some embodiments, arranging the flexible electronic device 110 in the cavity 116 may include forcing the contact surface 122 of the flexible electronic device 110 into the amount of the encapsulant 130 dispensed into the cavity 116 at level L1, such that a portion of the amount of the encapsulant 130 displaces around the contact surface 122 of the flexible electronic device 110 (e.g., and into the gap area 204).

Level L2 may correspond to a level between the internal surface 120 of the cavity 116 and the first surface 108 of the mold shell 104. In one embodiment, the amount of encapsulant 130 may be dispensed to the level L2, and the flexible electronic device 110, and/or at least the contact surface 122 of the flexible electronic device 110, may be submerged in the dispensed amount of encapsulant 130.

In any event, the encapsulant 130 may be dispensed around a flexible electronic device 110 that is disposed in the cavity 116 of the mold shell 104 to completely cover the electronic devices 126 of the flexible electronic device 110. In one embodiment, the encapsulant 130 may be dispensed to be flush with the first surface 108 of the mold shell 104 (e.g., at level L3). In some embodiments, the encapsulant 130 may be dispensed to extend above the first surface 108 to an overfilled surface 212. For instance, the encapsulant 130 may be dispensed to raise above the first surface 108 (e.g., to level L4) at least within the perimeter of the cavity 116. The raised encapsulant 130 at the overfilled surface 212 may be displaced outwardly from the center of the mold shell 104 (e.g., toward the sides 106A-106D) by a cover, or other object, that is placed on the overfilled surface 212 of the encapsulant 130 in a direction toward the first surface 108. In this case, pressure, P, from the cover may force the encapsulant 130 onto the first surface 108 that surrounds the cavity 116 of the mold shell 104. Once cured, this encapsulant 130 may adhere to the mold shell 104 and provide a bond between the mold shell 104 and the cover.

It is an aspect of the present disclosure that the encapsulant 130 may be dispensed in any number of stages (e.g., to one or more of the layers L1-L4 illustrated) providing layers of encapsulant 130 that can adhere to one another and to other objects (e.g., flexible electronic device 110, etc.). This approach, among other things, allows the flexible electronic device 110 to be disposed in the cavity 116 without directly contacting the interior walls or surfaces of the cavity 116 and without requiring the use of additional protrusions, standoffs, insert molded objects, or other aids. Additionally or alternatively, the encapsulant 130 may be deposited onto the various surfaces of the cavity 116 and/or the flexible electronic device 110 via other dispensing and/or disposition methods. For example, the encapsulant 130 may be dispensed, or applied, in one or more layers via chemical vapor deposition (CVD), physical vapor deposition (PVD), and/or any other type of vapor deposition.

In one embodiment, the encapsulant 130 may be dispensed in the form of film layers that are placed in the cavity 116 of the mold shell 104. For instance, dispensing the encapsulant 130 may comprise applying a first TPU film inside the cavity 116 in contact with the internal surface 120. Next, the flexible electronic device 110 may be placed on top of the first TPU film and a second TPU film may be applied to the flexible electronic device 110 and at least a portion of the first TPU film. In this case, heat and pressure may be applied to the laminate including the TPU films and the flexible electronic device 110 to fully bond the films to the mold shell 104 and encapsulate the flexible electronic device 110. In some embodiments, a vacuum laminator may be used to eliminate, or prevent, the formation of bubbles during the melt of the TPU films.

Figure 3A:
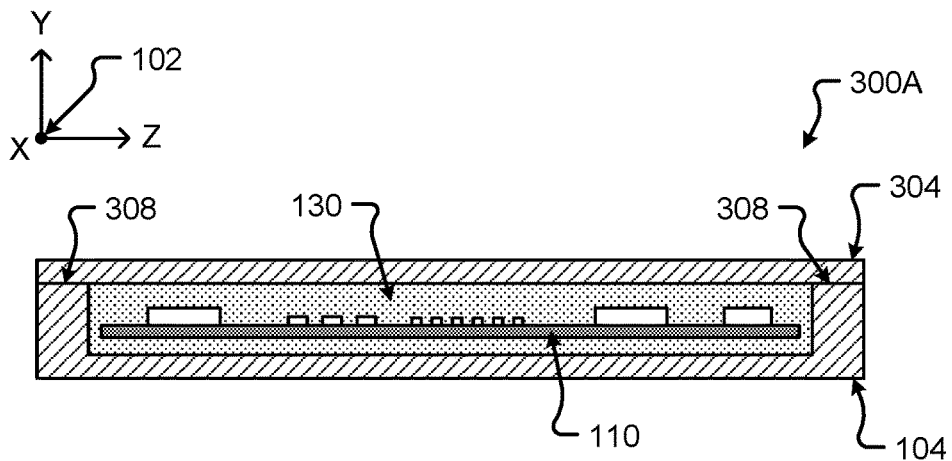
FIG. 3A shows a cross-section view of the encapsulated flexible electronic device including a single external cover in accordance with embodiments of the present disclosure.
Figure 3B:
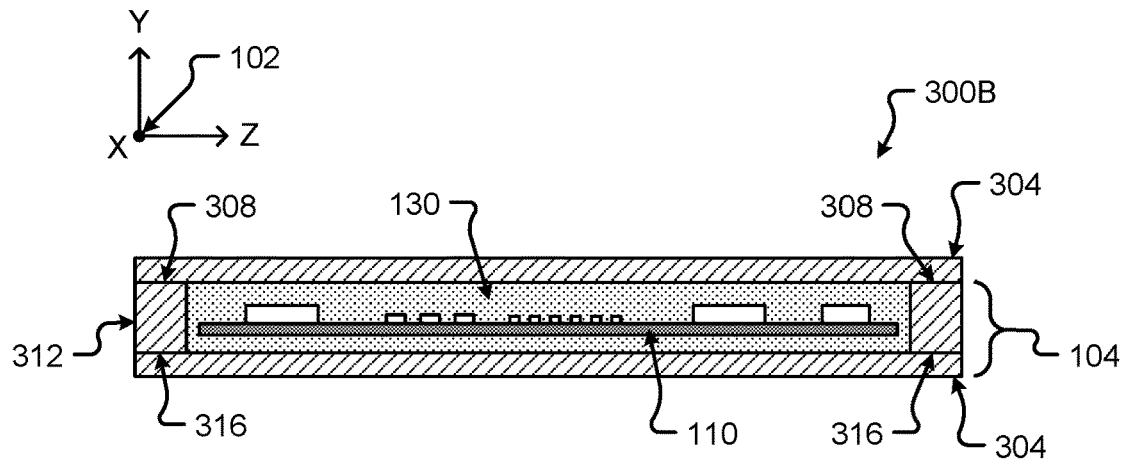
FIG. 3B shows a cross-section view of the encapsulated flexible electronic device including multiple external covers in accordance with embodiments of the present disclosure.
Figure 3C:
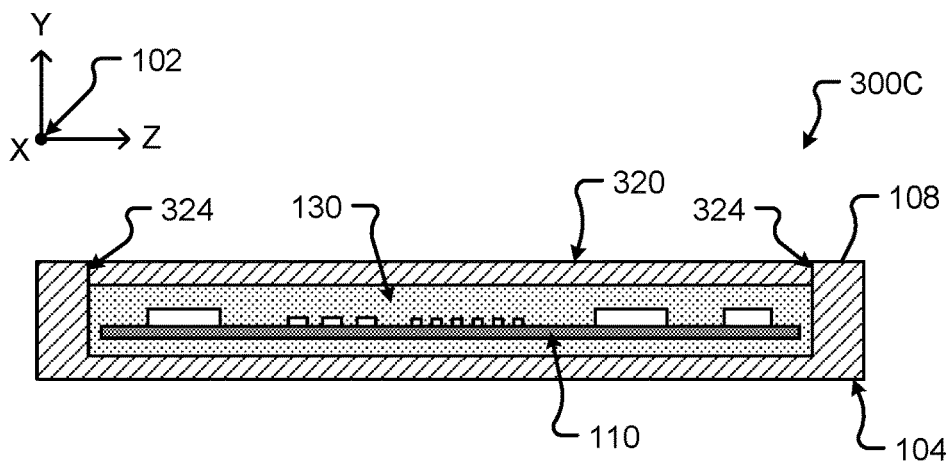
FIG. 3C shows a cross-section view of the encapsulated flexible electronic device including a single internal cover in accordance with embodiments of the present disclosure.

Referring now to FIGS. 3A-3C, cross-section views of various encapsulated flexible electronic devices 300A-300C are shown in accordance with embodiments of the present disclosure. The cross-section views of FIGS. 3A-3C may correspond to the cross-section of the encapsulated flexible electronic device 100 taken through line 2A-2A of FIG. 1A. In each of FIGS. 3A-3C, the encapsulated flexible electronic devices 300A-300C comprise a flexible electronic device 110, an encapsulant 130, and various forms of the mold shell 104.

FIG. 3A shows a single-cover encapsulated flexible electronic device 300A comprising a cover 304 bonded to the encapsulant 130 and the mold shell 104. The cover 304 may be bonded to the first surface 108 of the mold shell 104 at the first bond areas 308. For instance, as described in FIG. 2B, a portion of the encapsulant 130 may be displaced, or deposited, onto the first surface 108 of the mold shell 104. In this example, after the cover 304 is applied to the mold shell 104 (e.g., contacting the encapsulant 130), the portion of the encapsulant 130 disposed between the cover 304 and the first surface 108 may bond the cover 304 to the mold shell 104. In one embodiment, the cover 304 may be bonded to the first surface 108 of the mold shell 104 by applying an adhesive layer, other than encapsulant 130, therebetween. For example, a glue, sealant, epoxy, or other adhesive may be applied to the first surface 108 of the mold shell 104.

When the cover 304 is placed in contact with the mold shell 104 and the encapsulant 130, an outer perimeter of the cover 304 may contact the adhesive sealing the outer perimeter of the cover 304 to the mold shell 104. In some embodiments, when the cover 304 is bonded to the first surface 108 of the mold shell 104, the cover 304 may be referred to herein as an external cover.

FIG. 3B shows a double-cover encapsulated flexible electronic device 300B comprising a cover 304 bonded at a first bond area 308 of the mold shell 104 and a cover 304 bonded at a second bond area 316 (arranged on an opposite side) of the mold shell 104. In FIG. 3B, the hollow mold shell 312 may be configured with a cavity 116 that passes from one surface of the mold shell 104 (e.g., the first surface 108) completely through the body of the hollow mold shell 312. The mold shell 104 of the double-cover encapsulated flexible electronic device 300B may be made by first adhering, or otherwise affixing, the cover 304 to the mold shell 104 at the second bond area 316 and then depositing the encapsulant 130 in the cavity 116 of the mold shell 104. Next, the cover 304 at the first bond area 308 may be attached as described above. Among other things, this approach may allow the mold shell 104 to be made using separate parts that can be molded, extruded, and/or otherwise simply formed. These simple separate parts may later be bonded together to form the shape of the mold shell 104 described herein (e.g., including the cavity 116 for receiving the flexible electronic device 110 and encapsulant 130 etc.).

FIG. 3C shows an internal-cover encapsulated flexible electronic device 300C comprising an internal cover 320 bonded to the encapsulant 130 and the mold shell 104 at the internal bond area 324. The uppermost surface of the internal cover 320 may be arranged flush, or near flush, with the first surface 108 of the mold shell 104. In this case, the encapsulant 130 deposited inside the cavity 116 of the mold shell 104 may be underfilled (e.g., to level L1 or L2 described in conjunction with FIG. 2B) to allow the internal cover 320 to sit flush with the first surface 108. The internal cover 320 may be bonded to the interior surfaces of the mold shell 104 at the internal bond area 324, which may be arranged continuously around an internal periphery of the cavity 116 of the mold shell 104. The internal cover 320 may be attached to the cavity 116 at the internal bond area 324 as described above. For instance, a portion of the encapsulant 130 may be displaced from inside the cavity 116 to the internal bond area 324 and/or an adhesive may be applied to the internal periphery of the cavity 116 of the mold shell 104 before the internal cover 320 is cured to the mold shell 104 and the encapsulant 130.

In FIGS. 3A-3C, the mold shell 104, the cover 304, the hollow mold shell 312, and/or the internal cover 320 may be made via injection molding, rotational molding, extrusion molding, thermoforming, casting (e.g., into a pre-made mold), machining, and/or via any other shape-forming technique. Additionally or alternatively, the mold shell 104, the cover 304, the hollow mold shell 312, and/or the internal cover 320 may be made from a same material as the encapsulant 130 and/or vice versa. Depending on desired characteristics of the final encapsulated flexible electronic device 100, the materials may be selected to protect the flexible electronic device 110, offer flexibility, and/or selective rigidity. Examples of these materials may include, but are in no way limited to, silicone, TPU, rubber, RTV silicone, epoxy, acrylic, polymer materials, resins, thermosetting plastic, adhesive potting compounds, potting materials, etc., and/or combinations thereof. The selection of the encapsulation material may depend on the particular industry and/or application for the electronic device. For instance, a softer material may be selected for the encapsulant 130 and the other components of the encapsulated flexible electronic device 100 (e.g., the mold shell 104, the cover 304, the hollow mold shell 312, and/or the internal cover 320, etc.) to allow the encapsulated flexible electronic device 100 to be flexible when installed in a final product (e.g., wearable, garment, etc.), on an object (e.g., pipe, conduit, structural member, etc.) for monitoring, and/or where flexibility and/or rigidity is required for the encapsulated flexible electronic device 100. The materials of the encapsulated flexible electronic device 100 may be selected for particular insulative properties (e.g., thermal, electric, etc.), moisture-blocking capabilities, mechanical shock absorption, and/or the like FIGS. 4A-4C show exploded perspective views of the encapsulated flexible electronic devices 300A-300C shown in FIGS. 3A-3C, respectively. In FIGS. 4A-4C, the encapsulant 130 is removed for clarity of description. As illustrated in FIG. 4A, the first contact surface 406 of the cover 304 may be aligned to contact with the first surface 108 of the mold shell 104. In FIG. 4B, the hollow mold shell 312 is shown comprising a hollow cavity 116 that passes from the first surface 408 of the hollow mold shell 312 through the second surface 412 of the hollow mold shell 312. Similar to FIG. 4A, the first contact surface 406 of the cover 304 may be aligned to contact with the first surface 408 of the mold shell 312 and the second contact surface 420 of the opposing cover 304 may be aligned with the second surface 412 of the hollow mold shell 312 prior to bonding the covers 304 to the hollow mold shell 312. In FIG. 4C, the internal cover 320 may be bonded to the mold shell 104 when the second contact surface 424 is flush, or aligned in plane, with the first surface 108 of the mold shell 104.

Although described as including a cover 304, 320, embodiments of the present disclosure are not so limited. For instance, the encapsulated flexible electronic device 100 may include the mold shell 104, the flexible electronic device 110, and the encapsulant 130. In this case, the encapsulant 130 covering the flexible electronic device 110 may serve as a cover for the encapsulated flexible electronic device 100.

Figure 5A:
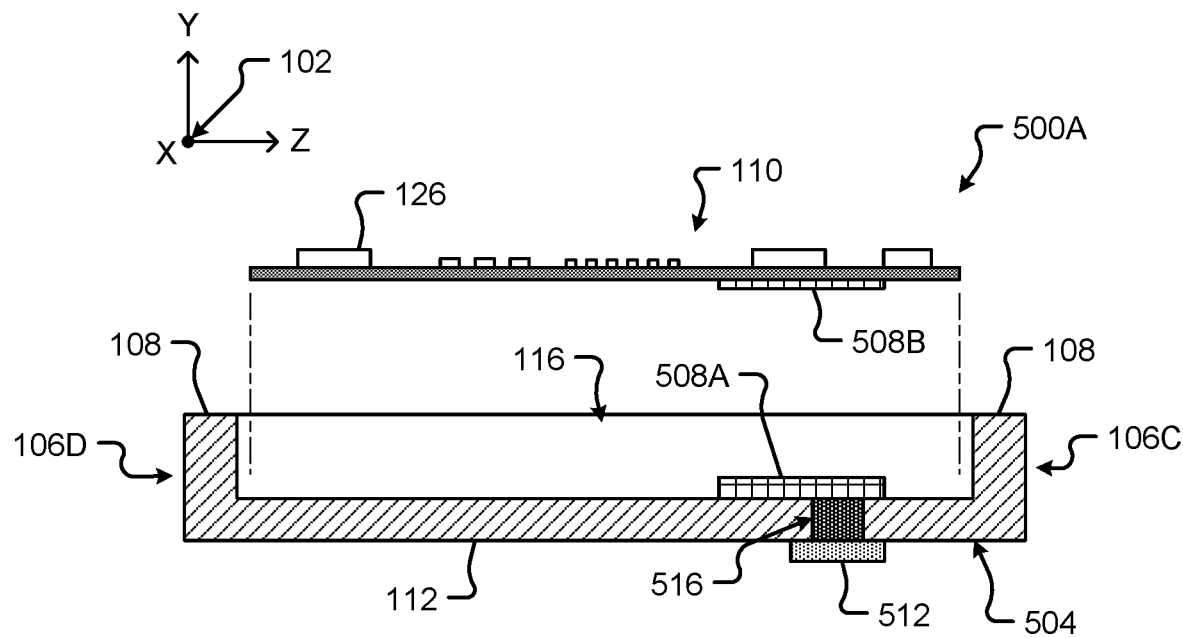
FIG. 5A shows a cross-section view of flexible electronic device disconnected from a mold shell including integrated electronics in accordance with embodiments of the present disclosure.
Figure 5B:
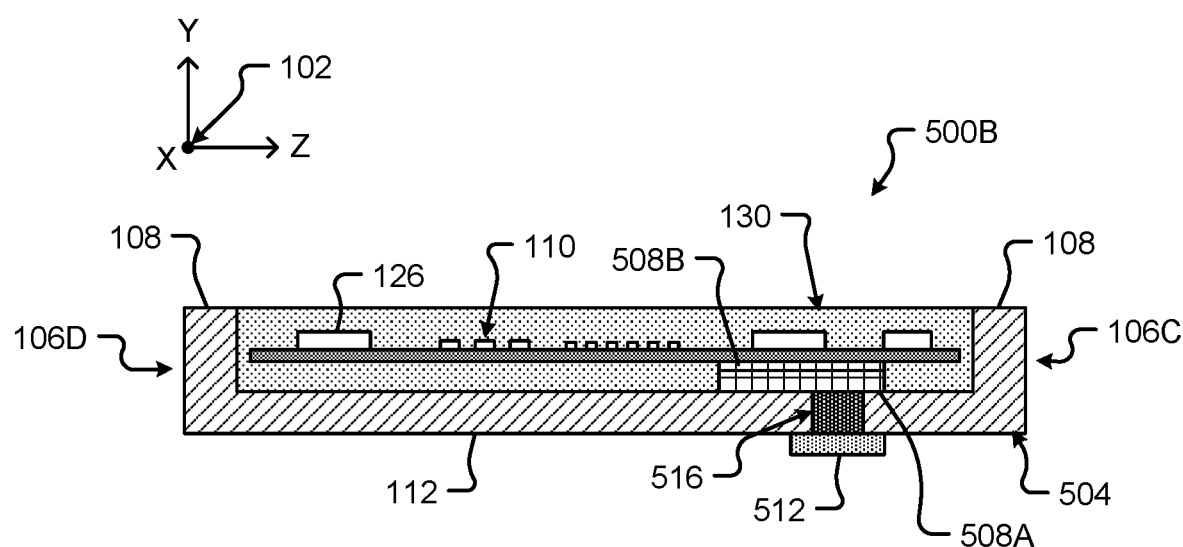
FIG. 5B shows a cross-section view of the flexible electronic device connected to the integrated electronics of the mold shell shown in FIG. 5A.

FIGS. 5A and 5B show cross-section views of a flexible electronic device 110 and a mold shell 504, comprising integrated package electronics, in a detached state (FIG. 5A) and in a connected state (FIG. 5B). The cross-section views of FIGS. 5A and 5B may correspond to the cross-section of the encapsulated flexible electronic device 100 taken through line 2A-2A of FIG. 1A. In FIG. 5A, the mold shell 504 includes a first connector 508A integrated as part of the mold shell 104. In one embodiment, the first connector 508A may provide an electrical interconnection between the flexible electronic device 110 disposed inside the cavity 116 and an external contact 512 disposed on an outer surface of the mold shell 504 and/or the encapsulated flexible electronic device 100. For example, the first connector 508A may be electrically interconnected to the external contact 512 by a connection via 516 that is part of, and passes through, the mold shell 504.

The connection via 516 may be one or more conductors that are insert molded in, and form a part of, the mold shell 504. In some embodiments, the connection via 516 may provide a hermetic electrical pass-through from an exterior of the encapsulated flexible electronic device 100 to an interior of the encapsulated flexible electronic device 100 (e.g., in the cavity 116 of the mold shell 504). The connection via 516, or conductive via, may connect the first connector 508a to the external contact 512. In some embodiments, the first connector 508A may correspond to a trace, conductor, copper strip, metal-plated region, or conductive ink that is printed, or otherwise, disposed in the internal surface 120 of the cavity 116. The corresponding second connector 508B may be electrically interconnected to the first connector 508A by a cable connector, soldering, conductive adhesive, etc. Components on the outside of the mold shell 104, such as a wireless charge coil, sensors (e.g., electrocardiogram (ECG) sensors, etc.), and/or the like, may communicate with the flexible electronic device 110 via the external contact 512 and the connection via 516.

The flexible electronic device 110 includes a second connector 508B that is electrically interconnected with the various electronic devices 126 of the flexible electronic device 110. This second connector 508B may correspond to a mating connector of the first connector 508A. During assembly, the first connector 508A of the flexible electronic device 110 may be physically interconnected with the second connector 508B providing the electrical interconnection between the flexible electronic device 110 disposed in the cavity 116 of the encapsulated flexible electronic device 100 and the external contact 512 disposed outside of the cavity 116. Once connected, the cavity 116 may be filled with encapsulant 130 forming the electrically-connected flexible electronic device package 500B shown in FIG. 5B.

FIG. 6A shows a cross-section view of a combination flexible and rigid package 600A of the encapsulated flexible electronic device 100 in accordance with embodiments of the present disclosure. In FIG. 6A, the cavity 116 of the mold shell 604 may be filled to a certain level with a rigid encapsulant 630. The rigid encapsulant 630 may be in a fluid, or liquid, form prior to curing and then, once cured, form into a rigid (e.g., inflexible) structure that covers the flexible electronic device 110. The combination flexible and rigid package 600A is shown including an internal cover 620 that encloses the flexible electronic device 110 and rigid encapsulant 630 in the cavity 116 of the mold shell 604. The mold shell 604 in FIG. 6A may be flexible, soft, and/or stretchable. This flexible structure of the mold shell 604 allows the flexible electronic device 110 to remain rigid, while providing a soft or compressible interface surrounding the flexible electronic device 110 and rigid encapsulant 630. In some embodiments, the mold shell 604 may be joined, or affixed, to one or more other substrates 612A, 612B. As illustrated in FIG. 6A, the mold shell 604 is attached to a first adjoining substrate 612A at a right-hand side of the mold shell 604 and a second adjoining substrate 612B at a left-hand side of the mold shell 604. These adjoining substrates 612A, 612B may both be flexible, rigid, and/or combinations thereof (e.g., one substrate rigid, while the other substrate is flexible, etc.).

FIG. 6B shows a cross-section view of a reinforced combination flexible and rigid package 600B of the encapsulated flexible electronic device 100 in accordance with embodiments of the present disclosure. The arrangement and construction of the reinforced combination flexible and rigid package 600B may be similar, if not identical, to the combination flexible and rigid package 600A described above. In the reinforced combination flexible and rigid package 600B, however, a mechanical structure 606 has been added to the mold shell 604. In one embodiment, the mechanical structure 606 may comprise a metal plate that is inserted in the cavity 116 of the mold shell 604 and/or molded as part of the mold shell 604. In addition to the rigid encapsulant 630, the mechanical structure 606 may provide mechanical reinforcement of the internal area of the reinforced combination flexible and rigid package 600B. For instance, the mechanical structure 606 may prevent the flexible electronic device 110 encapsulated by the rigid encapsulant 630 from bending. In some embodiments, the mechanical structure 606 may serve as a thermal heat sink for the flexible electronic device 110. For instance, the flexible electronic device 110 may be arranged in direct contact with the mechanical structure 606 inside the cavity 116 of the mold shell 604.

Figure 7:
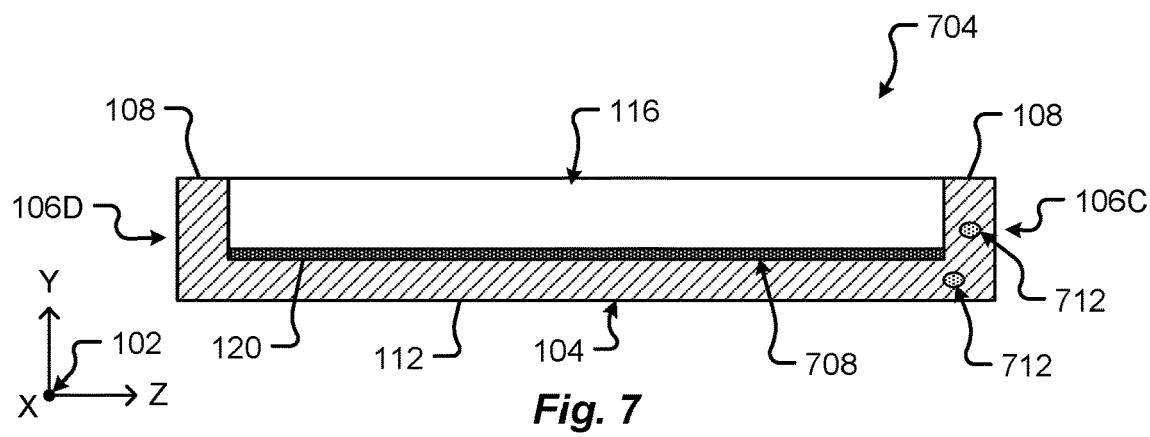
FIG. 7 shows a cross-section view of a shielded mold shell of the encapsulated flexible electronic device in accordance with embodiments of the present disclosure.

FIG. 7 shows a cross-section view of a shielded mold shell 704 of the encapsulated flexible electronic device 100 in accordance with embodiments of the present disclosure. The shielded mold shell 704 may be made through mixing the material of the shielded mold shell 704 with metal and/or ceramic particles 712 for heat dissipation and/or electromagnetic interference (EMI) shielding. In some embodiments, the internal surface 120, or other inner wall/surface, of the cavity 116 may include a thin metal layer applied thereto forming the EMI shielding. As shown in FIG. 7, this EMI shield 708 may correspond to a plated surface, a deposited metal layer, and/or an integrated (e.g., insert molded) metal layer disposed in the cavity 116 of the shielded mold shell 704.

Figure 8A:
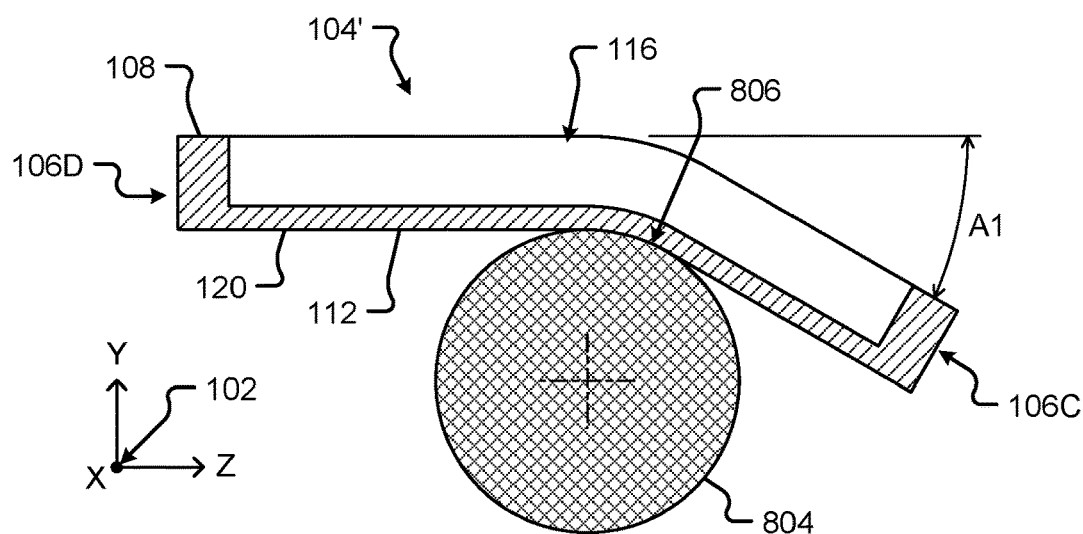
FIG. 8A shows a cross-section view of a formed mold shell of the encapsulated flexible electronic device in accordance with embodiments of the present disclosure.
Figure 8B:
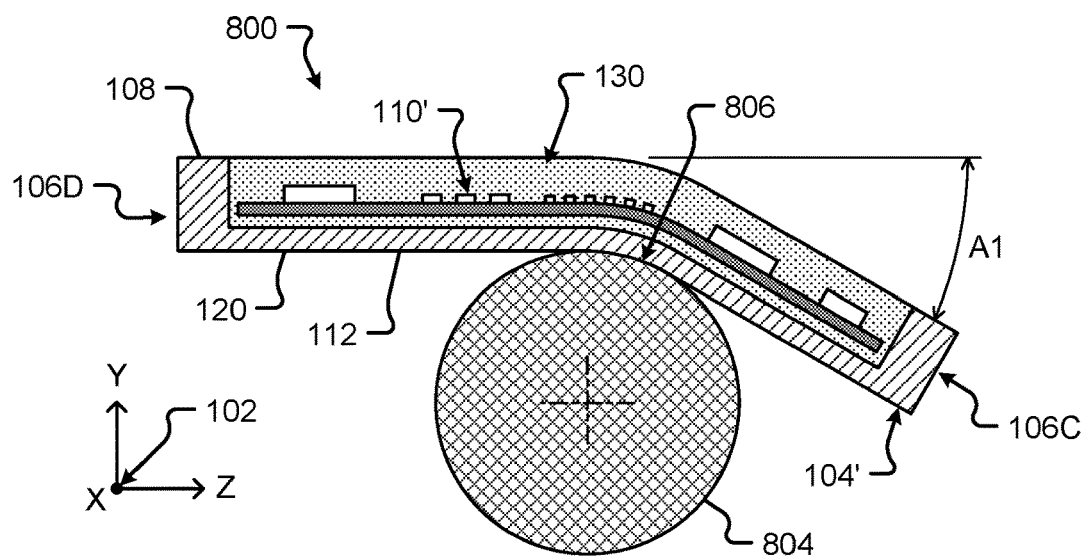
FIG. 8B shows a cross-section view of a formed mold shell of the encapsulated flexible electronic device comprising a bent flexible electronic device disposed therein in accordance with embodiments of the present disclosure.

FIGS. 8A and 8B show cross-section views of a formed mold shell 104' of the encapsulated flexible electronic device 100 in accordance with embodiments of the present disclosure. In FIG. 8A, the formed mold shell 104' has been bent around a mandrel 804, or other object comprising an arcuate surface 806. In particular, the second surface 112 of the formed mold shell 104' has been bent around an arcuate surface 806 of the mandrel 804 deflecting the third side 106C of the formed mold shell 104' out of the XZ-plane. For instance, the mandrel 804 is bent at an angle, A1, out of the XZ-plane (e.g., about the X-axis) providing a bent formed mold shell 104'. In FIG. 8B, the flexible electronic device 110 is disposed, in a flexed state, in the cavity 116 of the formed mold shell 104'. As illustrated in FIG. 8B, the flexible electronic device 110 is bent to conform with the bend of the formed mold shell 104'. The flexible electronic device 110 may be maintained in the bent, flexed, or formed state while encapsulant 130 is added to the cavity 116 of the formed mold shell 104'. Once the encapsulant 130 is cured, the formed mold shell 104' may be maintained in a flexed state forming the shaped encapsulated flexible electronic device 800.

Figure 9:
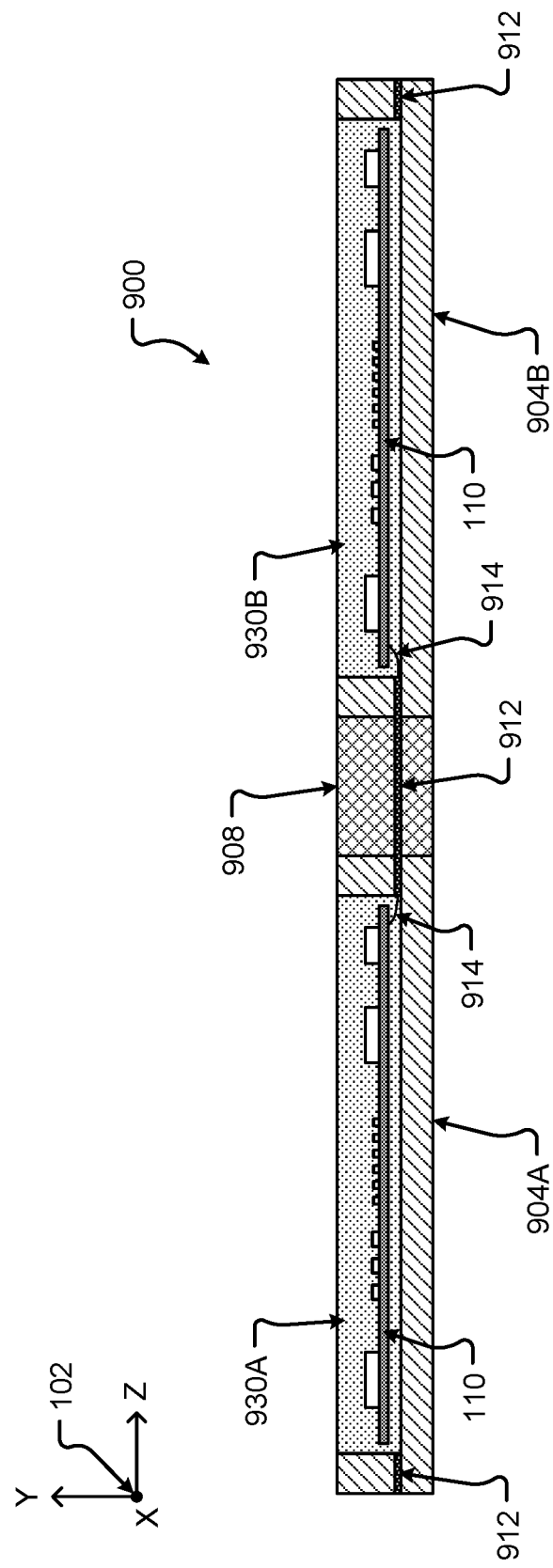
FIG. 9 shows a cross-section view of a rigid and flexible package of encapsulated electronic devices in accordance with embodiments of the present disclosure.

Referring now to FIG. 9, a cross-section view of a rigid and flexible package 900 of encapsulated electronic devices 100 are shown in accordance with embodiments of the present disclosure. The cross-section view of FIG. 9 may correspond to the cross-section of the encapsulated flexible electronic device 100 taken through line 2A-2A of FIG. 1A. In FIG. 9, one of the encapsulated flexible electronic devices 100 may be flexible and the other of the encapsulated flexible electronic devices 100 may be rigid. For example, the first mold shell 904A may include a cavity 116 that receives, and contains, a flexible electronic device 110 and a rigid encapsulant 930A disposed therein. As provided above, the rigid encapsulant 930A may be deposited in a liquid form and may cure in a hard, or rigid, solid form. The second mold shell 904B may include cavity 116 that receives, and contains, a flexible electronic device 110 and a flexible encapsulant 930B disposed therein. The flexible encapsulant 930B may be deposited in a liquid form and may cure in a soft, or flexible (e.g., allowing elastic deformation and bending, etc.), solid form. The flexible encapsulant 930B may allow the second mold shell 904B to remain flexible when cured, while the rigid encapsulant 930A may maintain a rigid structure of the first mold shell 904A when cured. The first mold shell 904A and second mold shell 904B may be made from one piece of material (e.g., comprising separate cavities 116). In one embodiment, the first mold shell 904A and the second mold shell 904B may be separately formed components that are bonded together at the mold shell joint structure 908. The mold shell joint structure 908 may correspond to an adhesive, sealant, mechanical connector, and/or other joining interface. In this example, the first mold shell 904A may have first material properties and the second mold shell 904B may have different second material properties. For example, the first mold shell 904A may be made from a rigid material (e.g., preventing flexure or resisting bending, etc.) and the second mold shell 904B may be made from a flexible material that is softer, or more flexible, than the first mold shell 904A, or vice versa.

As illustrated in FIG. 9, circuitry, or inter-mold connections 912, may be included as part of the rigid and flexible package 900 to connect the first mold shell 904A to the second mold shell 904B. In some embodiments, the inter-mold connection 912 may correspond to a flexible circuit that connects flexible electronic devices 110 disposed in separate cavities 116 (e.g., the cavity 116 of the first mold shell 904A and the cavity 116 of the second mold shell 904B. In one embodiment, the inter-mold connection 912 may correspond to a pre-printed (e.g., conductive ink, trace layer, etc.), or conductive layer that is deposited at least on the internal surface 120 of the cavity 116. In some embodiments, this inter-mold connection 912 may pass through a wall of one of the mold shells 904A, 904B to the other of the mold shells 904B, 904A. For instance, the inter-mold connection 912 may be similar to the connection via 516 described above and include one or more conductors that are insert molded in, and form a part of, the first mold shell 904A, the second mold shell 904B, and/or the inter-mold connection 912. The inter-mold connection 912 may provide a hermetic electrical pass-through from an interior of the cavity 116 of the first mold shell 904A to the interior of the cavity 116 of the second mold shell 904B. The flexible electronic device 110 disposed in each respective mold shell 904A, 904B may be electrically connected to the inter-mold connection 912 via one or more interconnections 914 (e.g., cables, wires, electrical bonds, conductive contacts, connectors, etc.).

Figure 10:
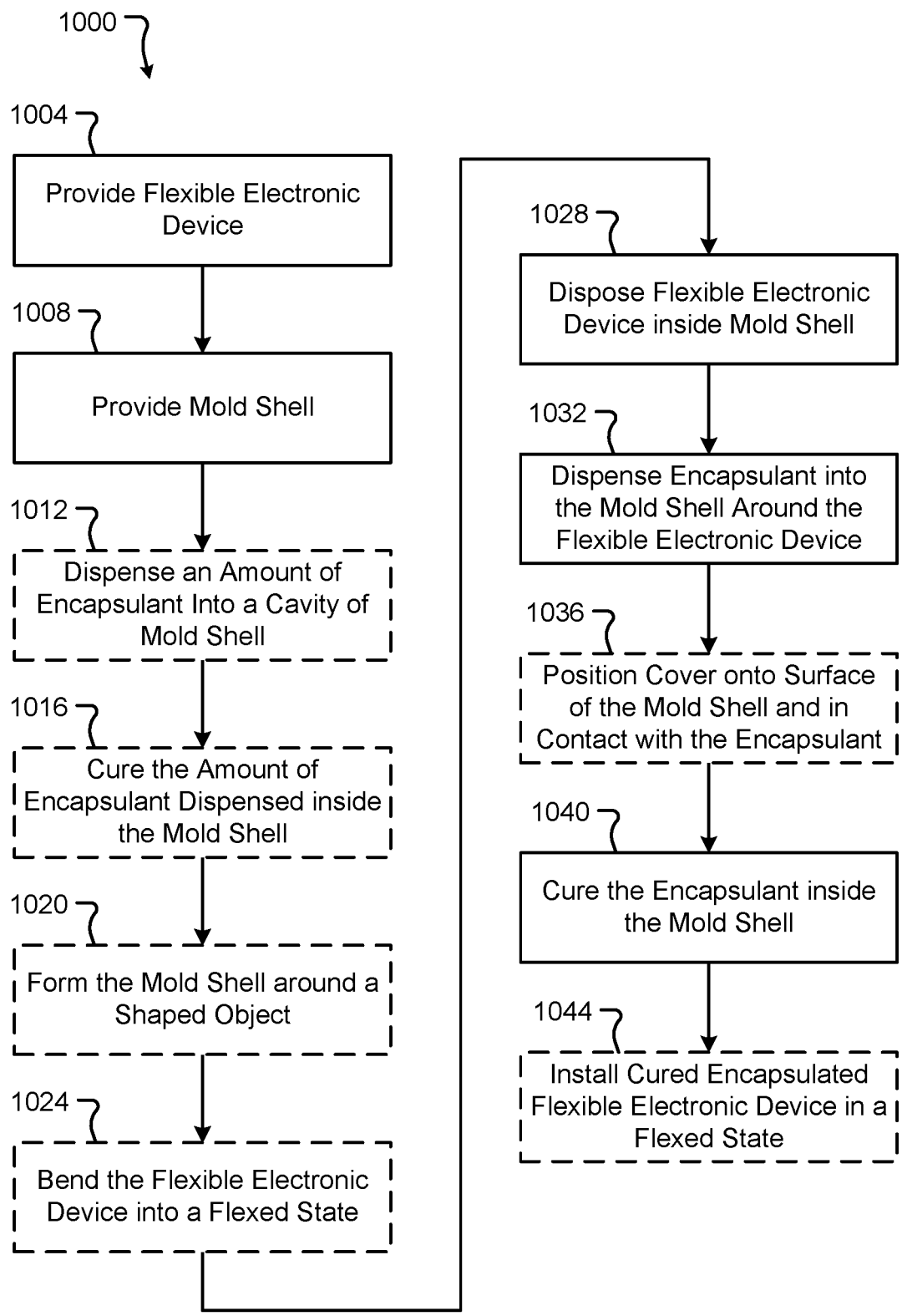
FIG. 10 is a flow diagram of a method for encapsulating a flexible electronic device in accordance with embodiments of the present disclosure.

FIG. 10 is a flow diagram of a method 1000 for encapsulating a flexible electronic device 110 in accordance with embodiments of the present disclosure. The method 1000 may be used to form any embodiment of the encapsulated flexible electronic device 100, 300A-300C, 500B, 600A, 600B, 800, 900 described herein. The method 1000 begins by providing a flexible electronic device 110 for encapsulation (step 1004). Next, the method 1000 proceeds by providing a mold shell 104 to receive the flexible electronic device 110 (step 1008). In some embodiments, the mold shell 104 may be made from one or more of silicone, rubber, TPU, and RTV silicone. The mold shell 104 may be molded into a shape (e.g., having a cavity 116, etc.) via injection molding, three-dimensional printing, casting, machining, and/or using some other molding or forming technique.

In some embodiments, the method 1000 may include dispensing an amount of encapsulant 130 into the cavity 116 of the mold shell 104 (step 1012). The amount of the encapsulant 130 may be dispensed to completely cover an internal surface (e.g., the internal surface 120) of the cavity 116. As described in conjunction with FIG. 2B, the amount of the encapsulant 130 may be dispensed at a level (e.g., L1, L2, etc.) that is offset from the dimension from the internal surface 120 of the cavity 116 but under the first surface 108 of the mold shell 104.

This dispensed amount of the encapsulant 130 may be allowed to at least partially cure inside the cavity 116 of the mold shell 104 (step 1016). In one embodiment, this partial cure may allow the amount of the encapsulant 130 to solidify from a liquid form to a solid form. Although the amount of the encapsulant 130 may not be completely set (e.g., and may be tacky to the touch), the amount of the encapsulant 130 in the cavity 116 may be capable of supporting the flexible electronic device 110.

It is an aspect of the present disclosure that the mold shell 104 may be formed, or bent, around a shaped object before encapsulating a flexible electronic device 110 therein (step 1020). In some embodiments, the mold shell 104 may be formed to suit a final installed product package shape. For instance, the encapsulated flexible electronic device 100 may be installed in a wearable product that conforms to the shape of human body part (e.g., wrist, chest, head, foot, etc.). In this case, the mold shell 104 may be formed in step 1020 comprising an arcuate bend shape that matches the shape of the human body part. While the mold shell 104 is formed, the flexible electronic device 110 may be bent to conform to the shape of the formed mold shell 104' prior, or during, the arrangement of the flexible electronic device 110 inside the cavity 116 of the formed mold shell 104' (step 1024).

The method 1000 continues by disposing the flexible electronic device 110 inside the mold shell 104 (step 1028). In some embodiments, this step may include placing the flexible electronic device 110 on the at least partially cured amount of encapsulant 130 dispensed in the cavity 116. In one embodiment, this step may include submerging a contact surface 122 of the flexible electronic device 110 in the amount of the encapsulant 130. It is an aspect of the present disclosure that the flexible electronic device 110 may be arranged in the cavity 116 such that no portion of the flexible electronic device 110 contacts an internal surface of the cavity 116. As shown in FIG. 2A, the flexible electronic device 110 may be arranged such that the contact surface 122 is offset from the internal surface 120 of the cavity 116 and the ends of the flexible electronic device 110 (e.g., closest to the sides 106A-106D of the mold shell 104) are separated from the inner walls of the cavity 116 by a gap area 204. The gap area 204 may provide a region inside the cavity 116 where encapsulant 130 may flow around the flexible electronic device 110, providing a buffer of encapsulant 130 material between the flexible electronic device 110 and the surfaces of the cavity 116.

In some embodiments, disposing the flexible electronic device 110 inside the mold shell 104 may include electrically interconnecting the flexible electronic device 110 to an electrical conductor of the mold shell 104. In one embodiment, the flexible electronic device 110 may be interconnected to the electrical conductor via a ribbon cable, flex cable, or other wiring connection. In some embodiments, the flexible electronic device 110 may be connected by positioning a conductive contact pad of the flexible electronic device 110 onto a corresponding conductive pad of the mold shell 104.

Once the flexible electronic device 110 is arranged in the mold shell 104, the method 1000 may continue by dispensing encapsulant 130 into the cavity 116 around at least a portion of the flexible electronic device 110 (step 1032). The encapsulant 130 may be dispensed in liquid form such that the encapsulant 130 flows into areas (e.g., the gap area 204, the area between the contact surface 122 and the internal surface 120, the area between level L0 and level L3, etc.) of the cavity 116. In one embodiment, the encapsulant 130 may be dispensed until the cavity 116 is overfilled (e.g., at level L4, etc.) with encapsulant 130. In this example, a portion of the overfilled encapsulant 130 may be displaced onto the first surface 108 surrounding the cavity 116.

The encapsulant 130 may be made from a material that is identical, or having the same chemical composition, as the mold shell 104. In some embodiments, using the same material may allow the encapsulant 130 to better bond to the mold shell 104 and form a continuous integral structure.

In some embodiments, the mold shell 104, the flexible electronic device 110, and the encapsulant 130 dispensed to cover the flexible electronic device 110 may be subjected to a vacuum to eliminate, or prevent, bubbles from forming during manufacturing of the encapsulated flexible electronic device 100. The vacuum may be applied while curing the encapsulant 130 inside the cavity 116 of the mold shell 104.

In one embodiment, the method 1000 may include positioning a cover 304, 320, 620 onto at least one surface of the mold shell 104 and/or the encapsulant 130 (step 1036). The cover 304, 320, 620 may be made from the same material as the mold shell 104, 604 and/or the encapsulant 130. In some embodiments, the cover 304, 320, 620 may be made from a polymer, rubber, TPU, silicone, leather, fabric, etc. The cover 304, 320, 620 may be arranged as a single layer or as a multiple-layer laminate, etc. The cover 304, 320, 620 may be mounted inside the cavity 116 and/or outside of the cavity 116. The cover 304 may be placed onto the dispensed encapsulant 130 (e.g., onto an overfilled surface 212 of the encapsulant 130) such that a portion of the encapsulant 130 displaces onto a surface between the cover 304 and the mold shell 104. This displaced portion of the encapsulant 130 may bond the cover 304 to the mold shell 104. In some embodiments, where the cover 304 is a fabric or leather material, the cover 304 may be sewn or stitched to the mold shell 104. In one embodiment, an adhesive may be applied between the cover 304, 320, 620 and the mold shell 104, 604 to create a bond therebetween.

Next, the method 1000 continues by curing the encapsulant 130 inside the mold shell 104 (step 1040). The encapsulant 130 may be time cured, temperature cured (e.g., heat cured, etc.), and/or pressure cured. In one embodiment, the encapsulant 130 may be light cured via, for example, exposure to ultraviolet light, etc. When cured, the encapsulant 130 may be opaque, transparent, or translucent. In some embodiments, the encapsulant 130 may cure into a hard, inflexible, rigid solid form. The hardness of an encapsulant 130 that is "rigid," as described herein, may be measured in the range of 95 Shore A to 80 Shore D. The hardness of an encapsulant 130 that is "flexible," as described herein, may be measured in the range of 10 Shore A to 90 Shore A. Additionally or alternatively, the encapsulant 130 may cure into a soft, flexible, and elastically deformable sold form.

In some embodiments, the mold shell 104 may be held in a formed shape while the encapsulant 130 is cured. For instance, the formed mold shell 104' may be held in a fixture while the encapsulant 130 surrounding a bent flexible electronic device 110 disposed in the cavity 116 of the formed mold shell 104' is cured. Once cured, the encapsulated flexible electronic device 100 may retain the shape in which the formed mold shell 104' was maintained, or held, during curing.

The encapsulated flexible electronic device 100 comprising cured encapsulant 130, the flexible electronic device 110, and the mold shell 104 may then be installed in a product or package, where the mold shell 104 remains an inseparable part of the encapsulated flexible electronic device 100 and becomes a part of the product. Among other things, the method 1000 described above provides an encapsulation for flexible electronic devices 110 that does not require high-temperature and high-pressure molding techniques (e.g., injection molding, compression molding, etc.) including electronics disposed in a separate mold. As can be appreciated, this method 1000 minimizes damage to the electronics and reduces the cost associated with expensive mold tooling (e.g., complex molds including removable dams, gates, and/or multiple parts, etc.) and eliminates the need for additional operations (e.g., edge trimming, separation, etc.) that are required in conventional molding. Moreover, because the mold shell 104 becomes a part of the final product after encapsulation, the mold shell 104 can be made in any number of ways with low cost and high volume.

References in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in conjunction with one embodiment, it is submitted that the description of such feature, structure, or characteristic may apply to any other embodiment unless so stated and/or except as will be readily apparent to one skilled in the art from the description.

Any of the steps, functions, and operations discussed herein can be performed continuously and automatically.

While the flowchart has been discussed and illustrated in relation to a particular sequence of events, it should be appreciated that changes, additions, and omissions to this sequence can occur without materially affecting the operation of the disclosed embodiments, configuration, and aspects.

The exemplary systems and methods of this disclosure have been described in relation to a method for electronic module molding and encapsulation. However, to avoid unnecessarily obscuring the present disclosure, the preceding description omits a number of known structures and devices. This omission is not to be construed as a limitation of the scope of the claimed disclosure. Specific details are set forth to provide an understanding of the present disclosure. It should, however, be appreciated that the present disclosure may be practiced in a variety of ways beyond the specific detail set forth herein.

A number of variations and modifications of the disclosure can be used. It would be possible to provide for some features of the disclosure without providing others.

The present disclosure, in various embodiments, configurations, and aspects, includes components, methods, processes, systems and/or apparatus substantially as depicted and described herein, including various embodiments, subcombinations, and subsets thereof. Those of skill in the art will understand how to make and use the systems and methods disclosed herein after understanding the present disclosure. The present disclosure, in various embodiments, configurations, and aspects, includes providing devices and processes in the absence of items not depicted and/or described herein or in various embodiments, configurations, or aspects hereof, including in the absence of such items as may have been used in previous devices or processes, e.g., for improving performance, achieving ease, and/or reducing cost of implementation.

The foregoing discussion of the disclosure has been presented for purposes of illustration and description. The foregoing is not intended to limit the disclosure to the form or forms disclosed herein. In the foregoing Description for example, various features of the disclosure are grouped together in one or more embodiments, configurations, or aspects for the purpose of streamlining the disclosure. The features of the embodiments, configurations, or aspects of the disclosure may be combined in alternate embodiments, configurations, or aspects other than those discussed above. This method of disclosure is not to be interpreted as reflecting an intention that the claimed disclosure requires more features than are expressly recited in each claim. Rather, as the following claims reflect, inventive aspects lie in less than all features of a single foregoing disclosed embodiment, configuration, or aspect. Thus, the following claims are hereby incorporated into this Description, with each claim standing on its own as a separate preferred embodiment of the disclosure.

Moreover, though the description of the disclosure has included description of one or more embodiments, configurations, or aspects and certain variations and modifications, other variations, combinations, and modifications are within the scope of the disclosure, e.g., as may be within the skill and knowledge of those in the art, after understanding the present disclosure. It is intended to obtain rights, which include alternative embodiments, configurations, or aspects to the extent permitted, including alternate, interchangeable and/or equivalent structures, functions, ranges, or steps to those claimed, whether or not such alternate, interchangeable and/or equivalent structures, functions, ranges, or steps are disclosed herein, and without intending to publicly dedicate any patentable subject matter.

Embodiments include a method of encapsulating a flexible electronic device that is elastically deformable between a flexed state and an unflexed state, comprising: providing a mold shell made from a first encapsulation material; disposing a portion of the flexible electronic device inside the mold shell; dispensing an encapsulant made from a second encapsulation material in a liquid form into the mold shell around the portion of the flexible electronic device; and curing the encapsulant inside the mold shell such that the encapsulant bonds to the mold shell and the flexible electronic device forming an encapsulated flexible electronic device comprising the cured encapsulant, the mold shell, and the flexible electronic device.

Aspects of the above method include wherein the mold shell comprises a cavity disposed in a first surface of the mold shell and extending a dimension into the mold shell without passing through the mold shell, and wherein disposing the portion of the flexible electronic device inside the mold shell comprises arranging the flexible electronic device inside the cavity of the mold shell. Aspects of the above method include wherein prior to arranging the flexible electronic device inside the cavity of the mold shell the method further comprises: dispensing an amount of the encapsulant into the cavity completely covering an internal surface of the cavity offset the dimension from the first surface of the mold shell. Aspects of the above method include wherein after dispensing the amount of the encapsulant into the cavity the method further comprises: curing, at least partially, the amount of the encapsulant dispensed into the cavity, and wherein arranging the flexible electronic device inside the cavity of the mold shell comprises forcing a contact surface of the flexible electronic device into the amount of the encapsulant dispensed into the cavity such that a portion of the amount of the encapsulant displaces around the contact surface of the flexible electronic device. Aspects of the above method include wherein arranging the flexible electronic device inside the cavity of the mold shell comprises: submerging a contact surface of the flexible electronic device in the amount of the encapsulant dispensed into the cavity. Aspects of the above method include wherein prior to curing the encapsulant inside the mold shell the method further comprises: positioning a cover made from a third encapsulation material onto the first surface of the mold shell and in contact with the encapsulant inside the mold shell. Aspects of the above method include wherein curing the encapsulant bonds the cover to the encapsulant and the first surface of the mold shell. Aspects of the above method include wherein the first encapsulation material, the second encapsulation material, and the third encapsulation material are a material having an identical chemical composition. Aspects of the above method include wherein the material is one of silicone, rubber, thermoplastic polyurethane (TPU), and room-temperature vulcanizing (RTV) silicone. Aspects of the above method include wherein the encapsulant, once cured, forms an integral and unremovable portion of the encapsulated flexible electronic device. Aspects of the above method include wherein the mold shell is elastically deformable, and wherein prior to disposing the portion of the flexible electronic device inside the mold shell the method further comprises: forming the mold shell around a mandrel such that the mold shell is curved. Aspects of the above method include further comprising: bending the flexible electronic device into the flexed state while disposing the portion of the flexible electronic device inside the mold shell formed around the mandrel; and maintaining the flexible electronic device in the flexed state while the encapsulant is dispensed into the mold shell around the portion of the flexible electronic device and while the mold shell is formed around the mandrel. Aspects of the above method include wherein the encapsulant is cured while the mold shell is formed around the mandrel and while the flexible electronic device is maintained in the flexed state.

Embodiments include an encapsulated flexible electronic device package prepared by a process, comprising: providing a flexible electronic device that is elastically deformable between a flexed state and an unflexed state; providing a mold shell made from an encapsulation material; disposing a portion of the flexible electronic device inside the mold shell; dispensing an encapsulant made from the encapsulation material in a liquid form into the mold shell around the portion of the flexible electronic device; and curing the encapsulant inside the mold shell such that the encapsulant bonds to the mold shell and the flexible electronic device forming the encapsulated flexible electronic device package comprising the cured encapsulant, the mold shell, and the flexible electronic device.

Aspects of the above encapsulated flexible electronic device package include wherein, once the encapsulant is cured, the encapsulated flexible electronic device package is flexible and elastically formable around an object. Aspects of the above encapsulated flexible electronic device package include wherein the encapsulation material is one of silicone, rubber, thermoplastic polyurethane (TPU), rubber, and room-temperature vulcanizing (RTV) silicone. Aspects of the above encapsulated flexible electronic device package include wherein prior to disposing the flexible electronic device inside the mold shell the process further comprises: dispensing an amount of the encapsulant into a cavity of the mold shell completely covering an internal surface of the cavity; curing, at least partially, an amount of the encapsulant dispensed into the cavity; and arranging the flexible electronic device inside the cavity by forcing a contact surface of the flexible electronic device into the amount of the encapsulant dispensed into the cavity such that a portion of the amount of the encapsulant displaces around the contact surface of the flexible electronic device. Aspects of the above encapsulated flexible electronic device package include wherein the mold shell is elastically deformable, and wherein prior to disposing the portion of the flexible electronic device inside the mold shell the process further comprises: forming the mold shell around a mandrel such that the mold shell is curved. Aspects of the above encapsulated flexible electronic device package include wherein the process further comprises: bending the flexible electronic device into the flexed state while disposing the portion of the flexible electronic device inside the mold shell formed around the mandrel; and maintaining the flexible electronic device in the flexed state while the encapsulant is dispensed into the mold shell around the portion of the flexible electronic device and while the mold shell is formed around the mandrel, and wherein the encapsulant is cured while the mold shell is formed around the mandrel and while the flexible electronic device is maintained in the flexed state.

Embodiments include a method, comprising: providing a flexible electronic device that is elastically deformable along a length of the flexible electronic device; providing a mold shell formed with an arcuate bend shape and comprising a cavity disposed therein, the mold shell made from an encapsulation material; forming the flexible electronic device to conform to the arcuate bend shape; inserting the flexible electronic device inside the cavity of the mold shell while formed to conform to the arcuate bend shape; dispensing an encapsulant made from the encapsulation material in a fluid form into the cavity of the mold shell and around the portion of the flexible electronic device while the flexible electronic device is formed to conform to the arcuate bend shape; and curing the encapsulant inside the mold shell such that the encapsulant bonds to the cavity of the mold shell and the flexible electronic device forming an encapsulated flexible electronic device comprising the cured encapsulant, the mold shell, and the flexible electronic device, and wherein the encapsulated flexible electronic device comprises the arcuate bend shape.

Any one or more of the aspects/embodiments as substantially disclosed herein.

Any one or more of the aspects/embodiments as substantially disclosed herein optionally in combination with any one or more other aspects/embodiments as substantially disclosed herein.

One or means adapted to perform any one or more of the above aspects/embodiments as substantially disclosed herein.

The phrases "at least one," "one or more," "or," and "and/or" are open-ended expressions that are both conjunctive and disjunctive in operation. For example, each of the expressions "at least one of A, B and C," "at least one of A, B, or C," "one or more of A, B, and C," "one or more of A, B, or C," "A, B, and/or C," and "A, B, or C" means A alone, B alone, C alone, A and B together, A and C together, B and C together, or A, B and C together.

The term "a" or "an" entity refers to one or more of that entity. As such, the terms "a" (or "an"), "one or more," and "at least one" can be used interchangeably herein. It is also to be noted that the terms "comprising," "including," and "having" can be used interchangeably.

The term "automatic" and variations thereof, as used herein, refers to any process or operation, which is typically continuous or semi-continuous, done without material human input when the process or operation is performed. However, a process or operation can be automatic, even though performance of the process or operation uses material or immaterial human input, if the input is received before performance of the process or operation. Human input is deemed to be material if such input influences how the process or operation will be performed. Human input that consents to the performance of the process or operation is not deemed to be "material."

The terms "determine," "calculate," "compute," and variations thereof, as used herein, are used interchangeably and include any type of methodology, process, mathematical operation or technique.

What is claimed is:

1. A method of encapsulating a flexible electronic device, comprising:
    providing a mold shell made from a first encapsulation material, wherein the mold shell comprises a cavity disposed in a first surface of the mold shell and extending a dimension into the mold shell without passing through the mold shell;
    dispensing a first amount of encapsulant into the cavity completely covering an internal surface of the cavity offset by the dimension from the first surface of the mold shell;
    arranging the flexible electronic device inside the cavity of the mold shell thereby submerging a contact surface of the flexible electronic device in the first amount of encapsulant dispensed into the cavity;
    dispensing a second amount of encapsulant into the mold shell around a portion of the flexible electronic device; and
    curing the first amount of encapsulant and the second amount of encapsulant inside the mold shell such that the cured first amount of encapsulant and the cured second amount of encapsulant bond to the mold shell and the flexible electronic device forming an encapsulated flexible electronic device comprising the cured first amount of encapsulant and the cured second amount of encapsulant, the mold shell, and the flexible electronic device.

2. The method of claim 1, wherein prior to curing the first amount of encapsulant and the second amount of encapsulant inside the mold shell the method further comprises:
    positioning a cover made from a second encapsulation material onto the first surface of the mold shell and in contact with the first amount of encapsulant and the second amount of encapsulant inside the mold shell.

3. The method of claim 2, wherein curing the first amount of encapsulant and the second amount of encapsulant bonds the cover to the second amount of encapsulant and the first surface of the mold shell.

4. The method of claim 2, wherein the first encapsulation material, and the second encapsulation material are a material having an identical chemical composition.

5. The method of claim 4, wherein the material is one of silicone, rubber, thermoplastic polyurethane (TPU), and room-temperature vulcanizing (RTV) silicone.

6. The method of claim 1, wherein the first amount of encapsulant and the second amount of encapsulant, once cured, forms an integral and unremovable portion of the encapsulated flexible electronic device.

7. The method of claim 1, wherein the mold shell is elastically deformable, and wherein prior to arranging the flexible electronic device inside the cavity of the mold shell the method further comprises:

forming the mold shell around a mandrel such that the mold shell is curved.

8. The method of claim 7, wherein the flexible electronic device is elastically deformable between a flexed state and an unflexed state, the method further comprising:
bending the flexible electronic device into the flexed state while arranging the flexible electronic device inside the cavity of the mold shell formed around the mandrel; and maintaining the flexible electronic device in the flexed state while the second amount of encapsulant is dispensed into the mold shell around the portion of the flexible electronic device and while the mold shell is formed around the mandrel.

9. The method of claim 8, wherein the first amount of encapsulant and the second amount of encapsulant is cured while the mold shell is formed around the mandrel and while the flexible electronic device is maintained in the flexed state.

10. The method of claim 1, wherein dispensing the first amount of encapsulant comprises pouring the first amount of encapsulant in a liquid form into the cavity.

11. The method of claim 1, wherein after dispensing the first amount of encapsulant into the cavity the method further comprises:
curing, at least partially, the first amount of encapsulant dispensed into the cavity, and wherein arranging the flexible electronic device inside the cavity of the mold shell comprises forcing the contact surface of the flexible electronic device into the first amount of encapsulant dispensed into the cavity such that a portion of the first amount of encapsulant displaces around the contact surface of the flexible electronic device.

12. An encapsulated flexible electronic device package prepared by a process, comprising:
providing a flexible electronic device;
providing a mold shell made from an encapsulation material;
dispensing a first amount of encapsulant into a cavity of the mold shell completely covering an internal surface of the cavity;
arranging the flexible electronic device inside the cavity of the mold shell submerging a contact surface of the flexible electronic device in the first amount of encapsulant dispensed into the cavity;
dispensing a second amount of encapsulant into the mold shell around a portion of the flexible electronic device; and
curing the first amount of encapsulant and the second amount of encapsulant inside the mold shell such that the cured first amount of encapsulant and the cured second amount of encapsulant bond to the mold shell and the flexible electronic device forming the encapsulated flexible electronic device package comprising the cured first amount of encapsulant and the cured second amount of encapsulant, the mold shell, and the flexible electronic device.

13. The encapsulated flexible electronic device package of claim 12, wherein, once the first amount of encapsulant and the second amount of encapsulant is cured, the encapsulated flexible electronic device package is flexible and elastically formable around an object.

14. The encapsulated flexible electronic device package of claim 13, wherein the encapsulation material is one of silicone, rubber, thermoplastic polyurethane (TPU), rubber, and room-temperature vulcanizing (RTV) silicone.

15. The encapsulated flexible electronic device package of claim 14, wherein prior to arranging the flexible electronic device inside the cavity of the mold shell the process further comprises:
curing, at least partially, a portion of the first amount of encapsulant dispensed into the cavity; and arranging the flexible electronic device inside the cavity by forcing the contact surface of the flexible electronic device into the portion of the first amount of encapsulant dispensed into the cavity such that the portion of the first amount of encapsulant displaces around the contact surface of the flexible electronic device.

16. The encapsulated flexible electronic device package of claim 15, wherein the mold shell is elastically deformable, and wherein prior to arranging the flexible electronic device inside the cavity of the mold shell the process further comprises:
forming the mold shell around a mandrel such that the mold shell is curved.

17. The encapsulated flexible electronic device package of claim 16, wherein the flexible electronic device is elastically deformable between a flexed state and an unflexed state, and wherein the process further comprises:
bending the flexible electronic device into the flexed state while arranging the flexible electronic device inside the cavity of the mold shell formed around the mandrel; and
maintaining the flexible electronic device in the flexed state while the second amount of encapsulant is dispensed into the mold shell around the portion of the flexible electronic device and while the mold shell is formed around the mandrel, and wherein the second amount of encapsulant is cured while the mold shell is formed around the mandrel and while the flexible electronic device is maintained in the flexed state.

18. The encapsulated flexible electronic device package of claim 12, wherein the flexible electronic device further comprises an electrical connector, wherein the mold shell comprises an electrical interconnection passing from an area inside the cavity to an area outside of the cavity through the mold shell, and wherein prior to curing the first amount of encapsulant and the second amount of encapsulant inside the mold shell, the process further comprises:
connecting the electrical connector of the flexible electronic device to the electrical interconnection of the mold shell.

19. The encapsulated flexible electronic device package of claim 18, wherein the electrical interconnection is a flexible printed circuit, wherein curing the first amount of encapsulant and the second amount of encapsulant hermetically seals the flexible electronic device inside the encapsulated flexible electronic device package.

20. A method, comprising:
providing a flexible electronic device that is elastically deformable along a length of the flexible electronic device;
providing a mold shell formed with an arcuate bend shape and comprising a cavity disposed therein, the mold shell being made from an encapsulation material;
forming the flexible electronic device to conform to the arcuate bend shape;
inserting the flexible electronic device inside the cavity of the mold shell while formed to conform to the arcuate bend shape;
dispensing an encapsulant made from the encapsulation material in a fluid form into the cavity of the mold shell and around a portion of the flexible electronic device while the flexible electronic device is formed to conform to the arcuate bend shape; and curing the encapsulant inside the mold shell such that the cured encapsulant bonds to the cavity of the mold shell and the flexible electronic device forming an encapsulated flexible electronic device comprising the cured encapsulant, the mold shell, and the flexible electronic device, and wherein the encapsulated flexible electronic device comprises the arcuate bend shape.

* * * * *